(12) United States Patent
Asao

(10) Patent No.: US 7,990,752 B2
(45) Date of Patent: Aug. 2, 2011

(54) SEMICONDUCTOR MEMORY

(75) Inventor: Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 177 days.

(21) Appl. No.: 12/476,950

(22) Filed: Jun. 2, 2009

(65) Prior Publication Data

US 2009/0296446 A1 Dec. 3, 2009

(30) Foreign Application Priority Data

Jun. 2, 2008 (JP) ................................. 2008-145179

(51) Int. Cl.
*G11C 11/00* (2006.01)
(52) U.S. Cl. ........................................ 365/148; 365/158
(58) Field of Classification Search .................. 365/148, 365/158
See application file for complete search history.

(56) References Cited

U.S. PATENT DOCUMENTS

| | | | | |
|---|---|---|---|---|
| 2006/0158919 | A1* | 7/2006 | Inaba | 365/63 |
| 2007/0091670 | A1* | 4/2007 | Hidaka | 365/158 |
| 2008/0239782 | A1 | 10/2008 | Asao et al. | |
| 2008/0308887 | A1 | 12/2008 | Asao et al. | |

OTHER PUBLICATIONS

M. Hosomi et al., "A Novel Nonvolatile Memory with Spin Torque Transfer Magnetization Switching: Spin-RAM" IEDM Tech., 2005, pp. 473-476.
Explanation of Non-English Language Reference(s).

* cited by examiner

*Primary Examiner* — Hoai V Ho
*Assistant Examiner* — Anthan T. Tran
(74) *Attorney, Agent, or Firm* — Knobbe, Martens, Olson & Bear LLP

(57) ABSTRACT

A semiconductor memory of an aspect of the present invention including a main bit line, a first and second sub-bit line, a first resistive memory element which has a first terminal being connected with the main bit line, a first select transistor which has one end of a first current path being connected with the second terminal of the first resistive memory element and the other end of the first current path being connected with the first sub-bit line, a second resistive memory element which has a third terminal being connected with the main bit line, and a second select transistor which has one end of a second current path being connected with the fourth terminal of the second resistive memory element and the other end of the second current path being connected with the second sub-bit line.

6 Claims, 21 Drawing Sheets

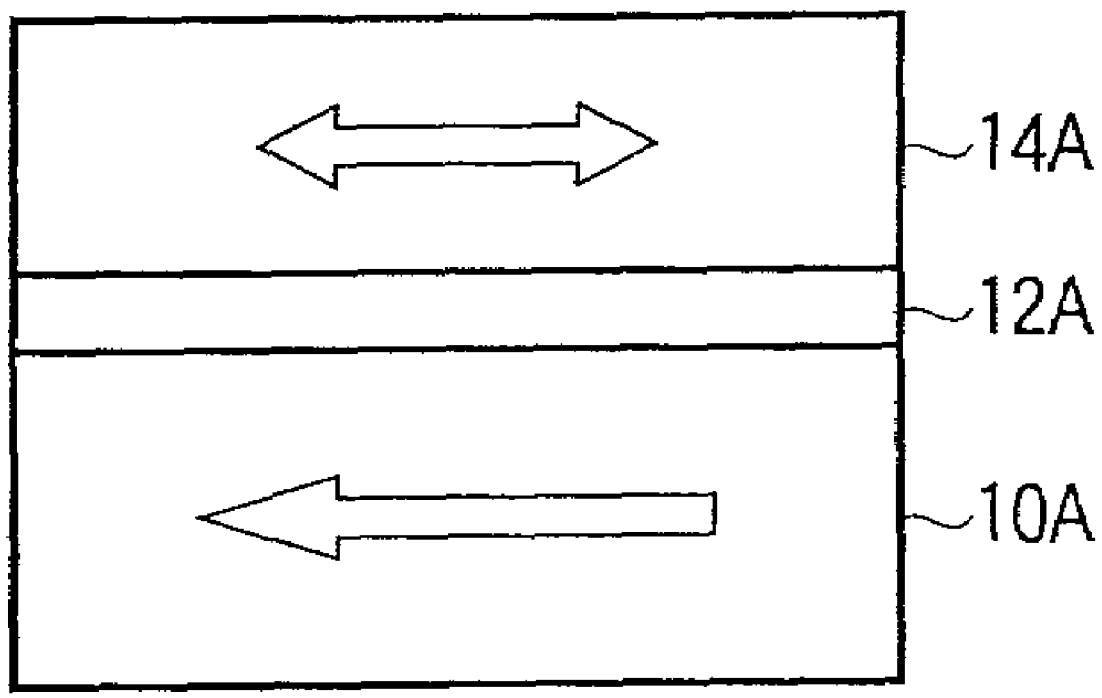
F I G. 5

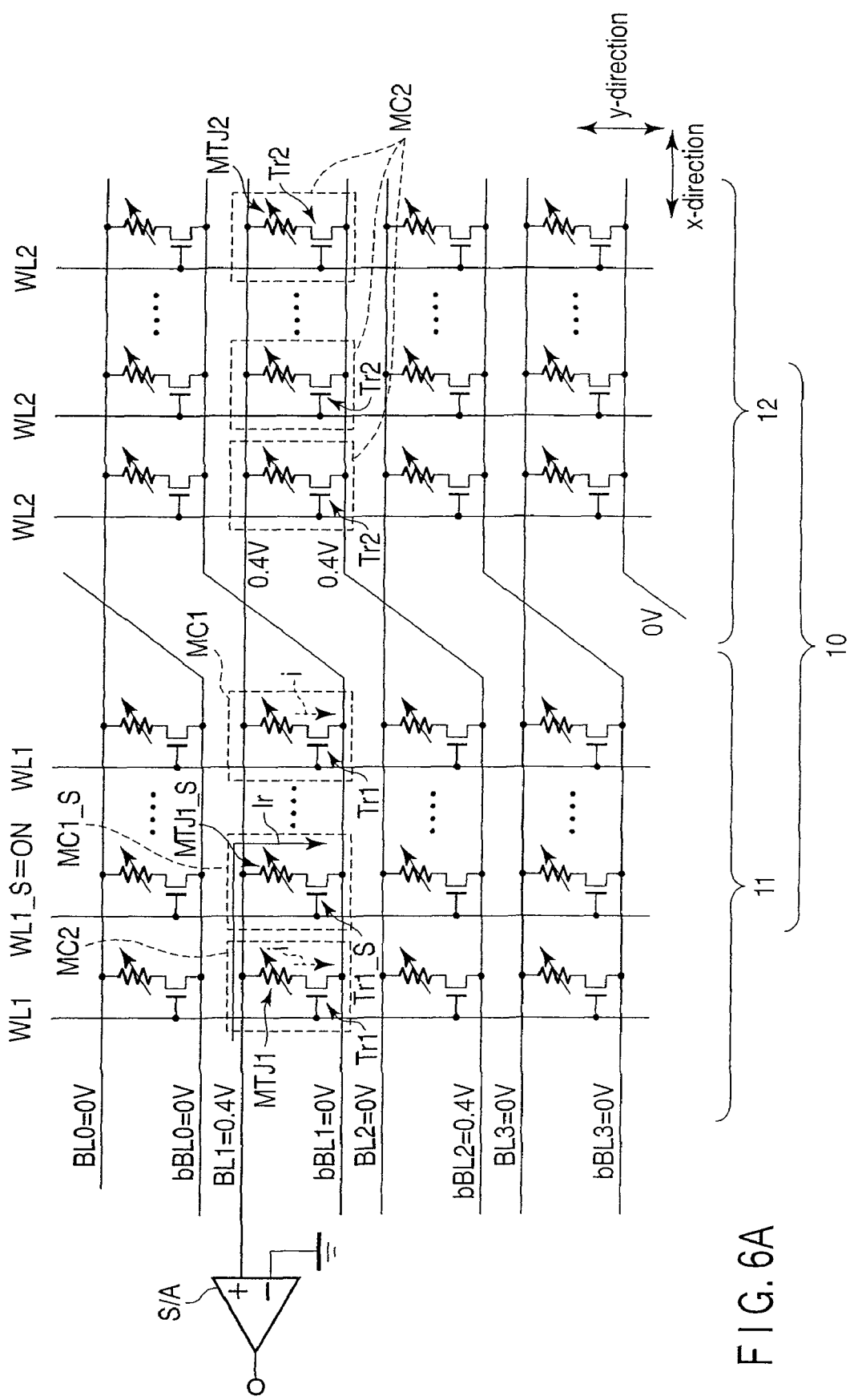
F I G. 6A

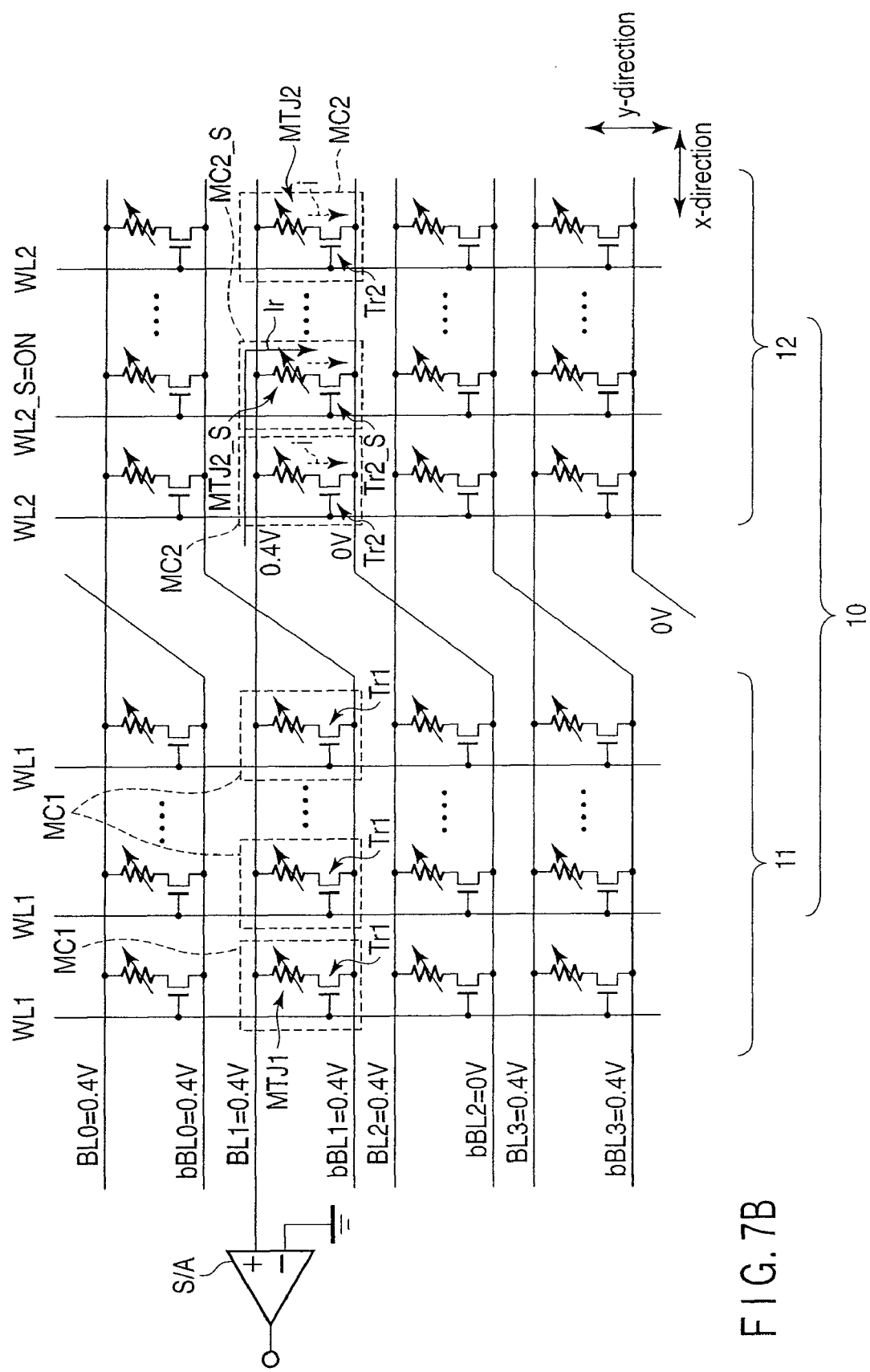
F I G. 7B

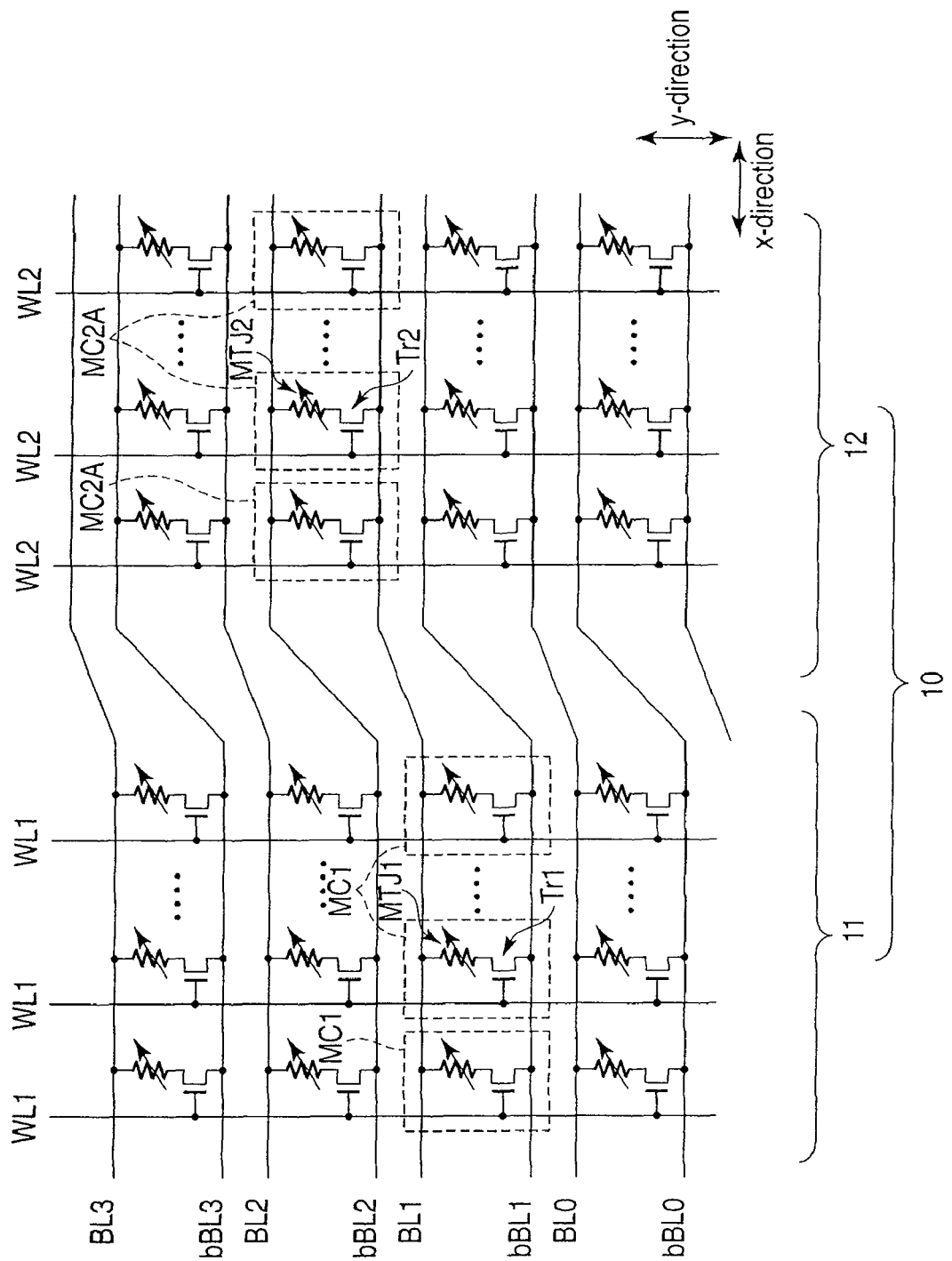
F I G. 9

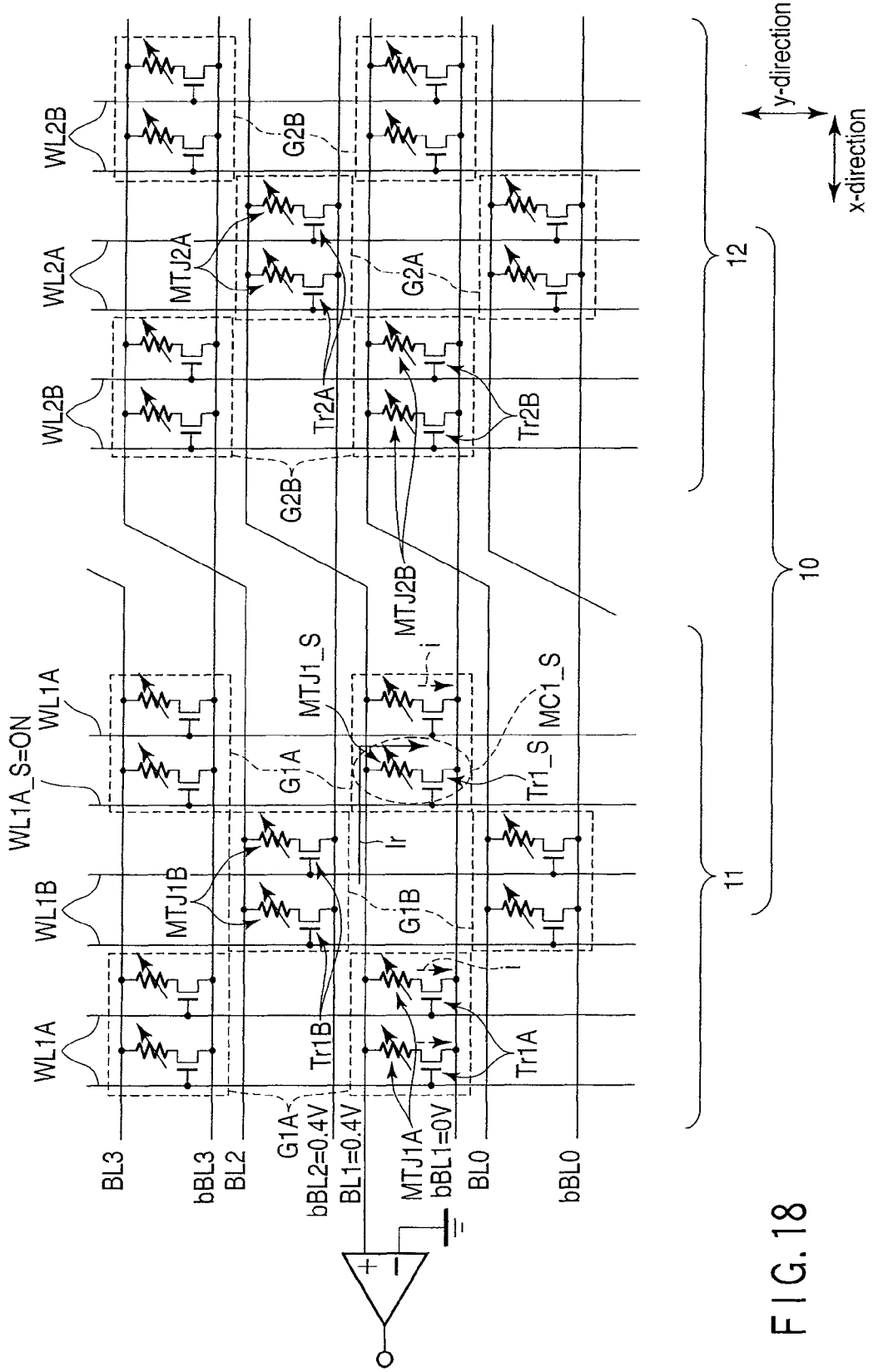
F I G. 18

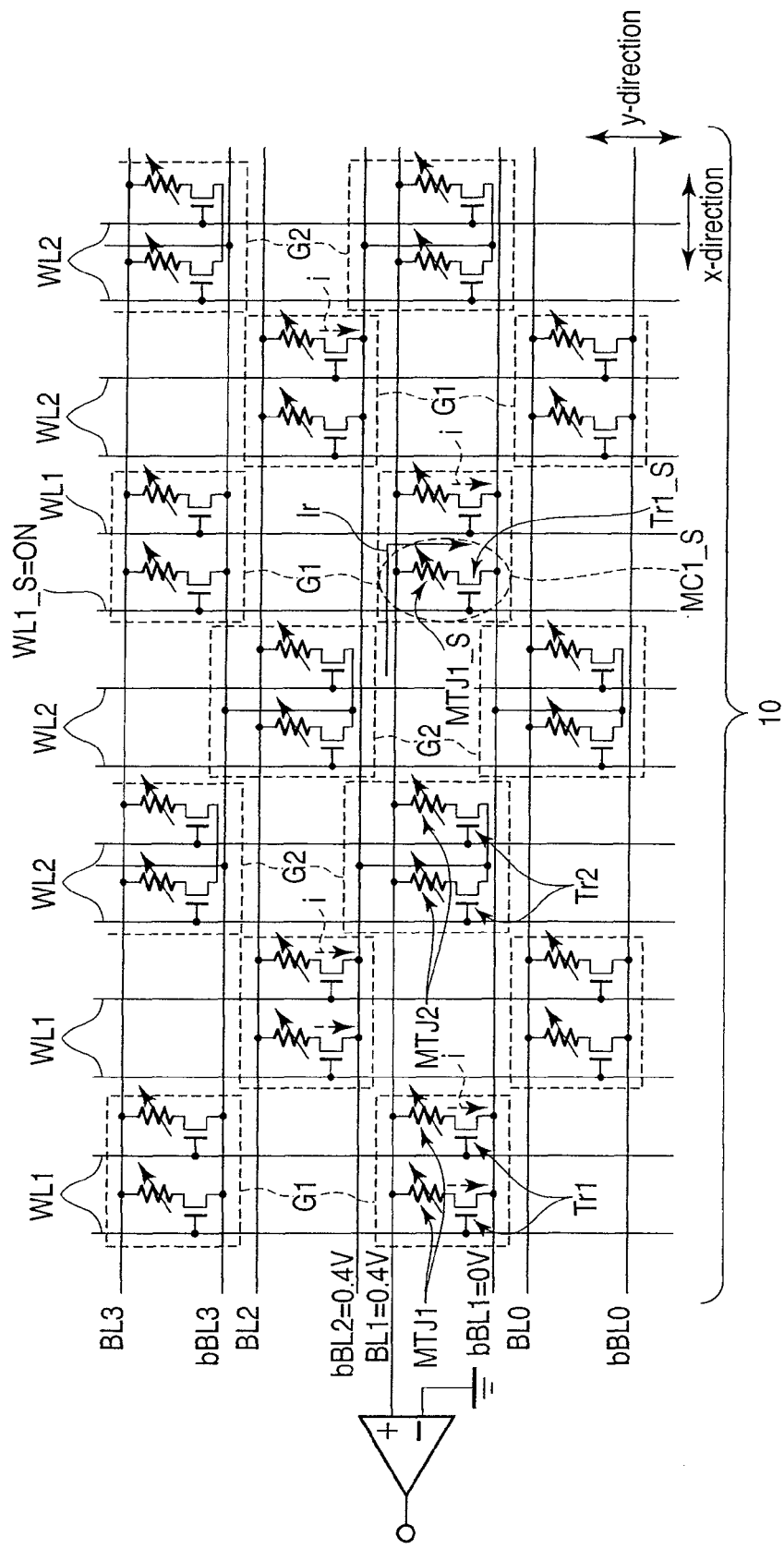
F I G. 20

SEMICONDUCTOR MEMORY

CROSS-REFERENCE TO RELATED APPLICATIONS

This application is based upon and claims the benefit of priority from prior Japanese Patent Application No. 2008-145179, filed Jun. 2, 2008, the entire contents of which are incorporated herein by reference.

BACKGROUND OF THE INVENTION

1. Field of the Invention

The present invention relates to a semiconductor memory, and more particularly, it relates to a semiconductor memory using resistive memory elements.

2. Description of the Related Art

In recent years, many types of memory storing information based on this new fundamental principle have been suggested. One of these memories is a spin transfer type magnetoresistive random access memory (e.g., in "A Novel Nonvolatile Memory with Spin Torque Transfer Magnetization Switching: Spin-RAM", IEDM2005 Technical Digest pp. 473-476).

In a magnetoresistive random access memory (MRAM), a magnetic tunnel junction (MTJ) element is used as a memory element. A MTJ element has a structure in which two magnetic layers (ferromagnetic layers) sandwich an insulating layer (a tunnel barrier) therebetween and utilizes a magnetic tunnel effect in which a resistance value varies according to a relative magnetizing direction (a spin direction) of the two magnetic layers to discriminate data "1" and data "0".

Usually, an antiferromagnetic layer is arranged on one side of the two magnetic layers. A magnetizing direction of one ferromagnetic layer is fixed by the antiferromagnetic layer, and a magnetizing direction of the ferromagnetic layer on the other side alone is variable. The ferromagnetic layer having the magnetizing direction fixed in this manner is called a magnetization invariable layer, whereas the ferromagnetic layer having the variable magnetizing direction is called a magnetization free layer. In the MRAM, changing a magnetizing direction of a magnetization free layer enables rewriting data in the MTJ element.

A plurality of memory cells are provided in a memory cell array of the MRAM. To one memory cell are connected one word line and two bit lines forming one pair of bit lines.

One memory cell has a so-called a 1Tr+1MTJ structure formed of, e.g., one MTJ element and an MIS (Metal-Insulator-Semiconductor) transistor that functions as a selective switch element with respect to the MTJ element.

In the spin transfer torque type MRAM, a current amount (a reversing threshold current) required for reversal of spin transfer magnetization of the MTJ element is defined by a current density flowing through the MTJ element. Therefore, with scaling of the MTJ element, the reversing threshold current can be also scaled. That is, a cell size of each memory cell can be relatively easily reduced in order to increase a storage capacity of the MRAM.

However, along with advances in miniaturization of memory cells, cutoff resistance properties of the MIS transistor constituting the memory cells cannot be sufficiently assured, and a leak current (which will be referred to as a cutoff current hereinafter) is produced.

The memory cell array in the MRAM has a structure in which a plurality of memory cells are connected with one pair of bit lines in common. Further, the MRAM selects one memory cell from the plurality of memory cells connected with the same pair of bit lines by selecting a word line, and executes a read or write operation with respect to the selected memory cell.

In the read operation of the MRAM, a potential of one bit line in the pair of bit lines is set to a high potential, and a potential of the other bit line is set to a low potential. As a result, a read current flows through the MTJ element in the selected cell, and a potential of the bit line fluctuates in accordance with a resistance value of this MTJ element. Detecting a fluctuation amount of this potential enables discriminating data.

As explained above, when the cutoff resistance properties of the MIS transistor in the memory cell are not assured and a cutoff current is produced from a non-selected cell, the potential of the bit line fluctuates due to this cutoff current, and a read margin of the MRAM is degraded.

BRIEF SUMMARY OF THE INVENTION

A semiconductor memory of an aspect of the present invention including: a first main bit line; a first sub-bit line forming a pair of bit lines with the first main bit line; a first word line extended in a direction crossing a direction of extension of the first main bit line; a first resistive memory element which has a first terminal and a second terminal, the first terminal being connected with the first main bit line; a first select transistor which has a first current path and a first gate electrode connected with the first word line, one end of the first current path being connected with the second terminal of the first resistive memory element, the other end of the first current path being connected with the first sub-bit line; a second sub-bit line forming a pair of bit lines with the first main bit line; a second word line extended in a direction crossing the direction of extension of the first main bit line; a second resistive memory element which has a third terminal and a fourth terminal, the third terminal being connected with the first main bit line; and a second select transistor which has a second current path and a second gate electrode connected with the second word line, one end of the second current path being connected with the fourth terminal of the second resistive memory element, the other end of the second current path being connected with the second sub-bit line.

A semiconductor memory of an aspect of the present invention including: a first main bit line; a first sub-bit line forming a pair of bit lines with the first main bit line; a first word line extended in a direction crossing a direction of extension of the first main bit line; a first resistive memory element which has a first terminal and a second terminal, the first terminal being connected with the first main bit line; a first select transistor which has a first current path and a first gate electrode connected with the first word line, one end of the first current path being connected with the second terminal of the first resistive memory element, the other end of the first current path being connected with the first sub-bit line; a second sub-bit line forming a pair of bit lines with the first main bit line; a second word line extended in a direction crossing the direction of extension of the first main bit line; a second resistive memory element which has a third terminal and a fourth terminal, the third terminal being connected with the second sub-bit line; and a second select transistor which has a second current path and a second gate electrode connected with the second word line, one end of the second current path being connected with the fourth terminal of the second resistive memory element, the other end of the second current path being connected with the first main bit line.

A semiconductor memory of an aspect of the present invention including: a memory sell array which is provided in a substrate and which has a first and second region; a first main bit line provided above the memory cell array; a first sub-bit line which is forming a pair of bit lines with the first main bit line and which is provided above the memory cell array; a second sub-bit line which is forming a pair of bit lines with the first main bit line and which is provided above the memory cell array; a first memory cell which is provided in the first region and which is connected with the main bit line and the first sub-bit line, and which has a first resistive memory element and a first select transistor; a second memory cell which is provided in the second region and which is connected with the main bit line and the second sub-bit line, and which has a second resistive memory element and a second select transistor; a first word line which is provided on the first region and which is extended in a direction crossing a direction of extension of the main bit line, and which is connected with a gate of the first select transistor; a second word line which is provided on the second region and which is extended in a direction crossing a direction of extension of the main bit line, and which is connected with a gate of the second select transistor.

BRIEF DESCRIPTION OF THE SEVERAL VIEWS OF THE DRAWING

FIG. 5 is a cross-sectional view showing a structure of a resistive memory element;

FIG. 6A is a view for explaining a read operation of the MRAM according to the first embodiment;

FIG. 7B is a view for explaining the read operation of the MRAM according to the second embodiment;

FIG. 9 is an equivalent circuit diagram of a memory cell array of an MRAM according to a third embodiment;

FIG. 18 is a view for explaining an equivalent circuit and a read operation of the MRAM according to the fourth embodiment;

FIG. 20 is a view for explaining a circuit configuration and a read operation of the MRAM according to the fifth embodiment.

DETAILED DESCRIPTION OF THE INVENTION

Several embodiments according to the present invention will now be described in detail with reference to the accompanying drawings.

A. Embodiments

Embodiments according to the present invention will now be described with reference to FIGS. 1 to 20.

[1] First Embodiment

A first embodiment according to the present invention will now be described with reference to FIGS. 1 to 7B.

(1) Basic Structure

A basic structure of a semiconductor memory according to a first embodiment of the present invention will now be described with reference to FIG. 1.

Figure 1:
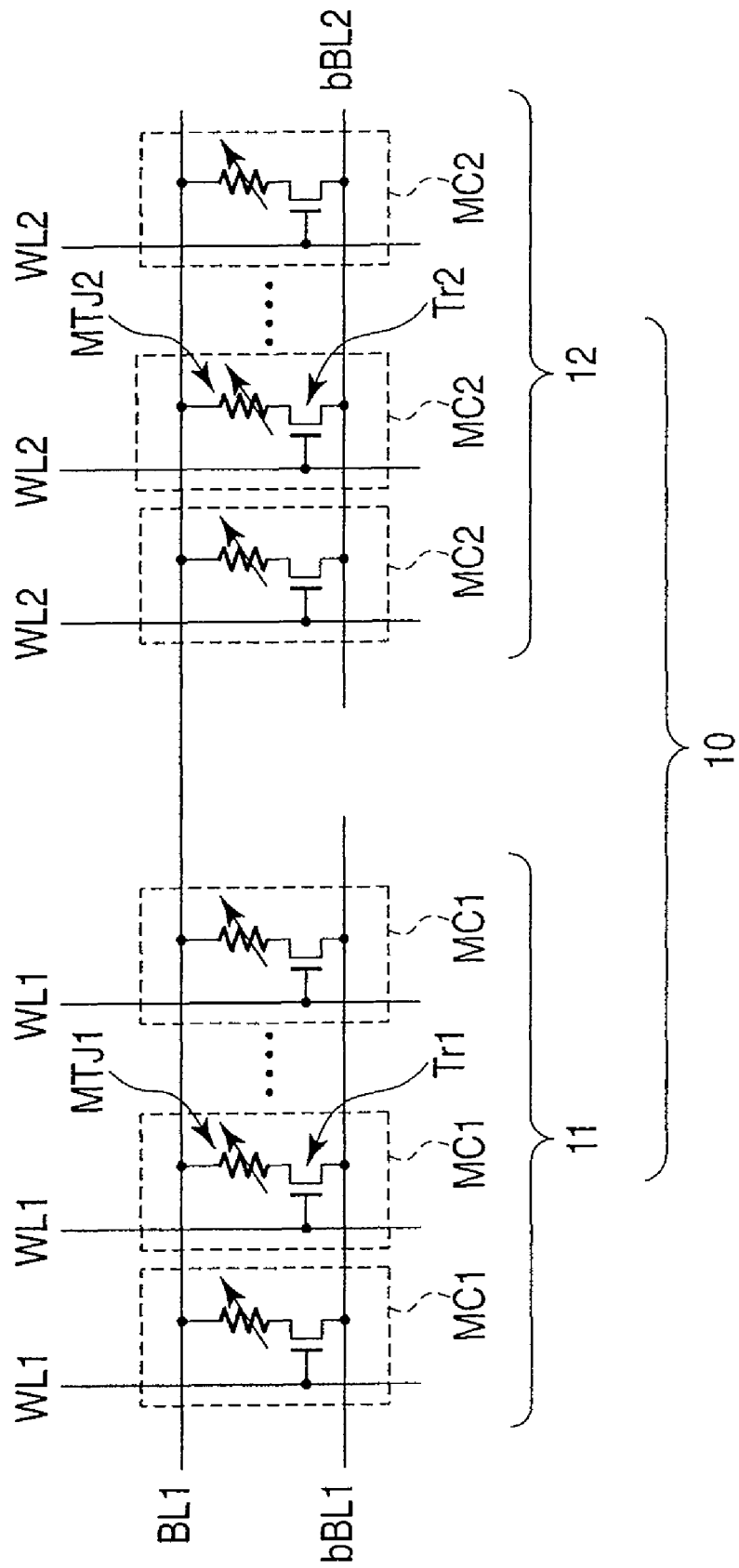
FIG. 1 is an equivalent circuit diagram for explaining a basic structure of an MRAM according to a first embodiment.

As shown in FIG. 1, a plurality of (e.g., m) first memory cells MC1 are provided in a first region 11 of a memory cell array 10. Further, a plurality of (e.g., n) second memory cells MC2 are provided in a second region 12 of the memory cell array 10. As control lines for the memory cells MC1 and MC2, a plurality of word lines WL1 and WL2 and a plurality of bit lines BL1, bBL1, and bBL2 are connected with the plurality of memory cells MC1 and MC2, respectively. However, in the embodiment of the present invention, the description will be given as to the example where the plurality of memory cells are provided in each of the regions 11 and 12 and connected with a pair of bit lines, but the present invention is not restricted thereto, and a structure where at least one memory cell is provided in each of the regions 11 and 12 can suffice.

One first memory cell MC1 is formed of one first resistive memory element MTJ1 that functions to store data and one first MIS transistor that functions as a selective switch element (which will be referred to as a select transistor hereinafter) Tr1. Like the first memory cell, one second memory cell MC2 is formed of one second resistive memory element MTJ2 and one second select transistor Tr2.

Each of the resistive memory element MTJ1 and MTJ2 has two ends. Each of the select transistors Tr1 and Tr2 has one current path and one gate electrode.

In the resistive memory element and the select transistor constituting one memory cell, one end (a second or fourth terminal) of the resistive memory element MTJ1 or MTJ2 is connected with one end of a current path of the select transistor Tr1 or Tr2.

A gate electrode of the select transistor Tr1 constituting the first memory cell MC1 is connected with the first word line WL1. Furthermore, a gate electrode of the select transistor Tr2 constituting the second memory cell MC2 is connected with the second word line WL2.

To the bit line BL1 is connected the other end (a first terminal) of the first resistive memory element MTJ1 constituting the first memory cell MC1. Moreover, the other end (a third terminal) of the second resistive memory element MTJ2 constituting the second memory cell MC2 is also connected with the bit line BL1.

The other end of the current path of the first select transistor Tr1 constituting the first memory cell MC1 is connected with the bit line bBL1.

On the other hand, the other end of the current path of the second select transistor Tr2 constituting the second memory cell MC2 is connected with the bit line bBL2.

In the above-explained structure, the bit line BL1 and the bit line bBL1 form one pair of bit lines with respect to the first memory cells MC1 in the first region 11, and the same bit line BL1 as that utilized by the first memory cells and the bit line bBL2 different from that utilized by the first memory cells form one pair of bit lines with respect to the second memory cells MC2 in the second region 12.

In the pair of bit lines BL1 and bBL1 or bBL2 connected with a memory cell selected for reading (a selected cell), the one bit line BL1 is set to, e.g., a high potential and the other bit line bBL1 or bBL2 forming the pair with the former bit line is set to, e.g., a low potential at the time of a read operation. A bit line through which a high potential is supplied to a selected cell will be referred to as a main bit line and a bit line through which a low potential is supplied to the selected cell will be referred to as a sub-bit line hereinafter.

The semiconductor memory according to the first embodiment of the present invention is characterized in that ends on one side (the first and the third terminal) of the resistive memory elements MTJ1 and MTJ2 respectively constituting the first and second memory cells MC1 and MC2 are connected with the same main bit line (a first main bit line) BL1 in common, one end of the current path of the select transistor Tr1 constituting the first memory cell is connected with the sub-bit line (a first sub-bit line) bBL1, and one end of the current path of the select transistor Tr2 constituting the second memory cell is connected with the other sub-bit line (a second sub-bit line) bBL2, which differs from the sub-bit line bBL1.

In the read operation of the semiconductor memory, a read current flows from the main bit line set to a high potential toward the sub-bit line set to a low potential through the resistive memory element and the select transistor in the selected cell. When a cutoff current is produced due to the select transistor in each non-selected cell, the cutoff current flows from the main bit line set to the high potential toward the sub-bit line set to the low potential.

In a conventional example, since one main bit line and one sub-bit line form a pair of bit lines, the cutoff current flowing from (m+n−1) non-selected cells excluding a selected cell is a concern when (m+n) memory cells are connected with the bit line BL1.

On the other hand, in the semiconductor memory according to this embodiment, each of the first sub-bit line bBL1 connected with m memory cells and the second sub-bit line bBL2 connected with n memory cells forms a bit line pair with the one main bit line BL1 connected with (m+n) memory cells.

For example, when reading data in one memory cell in the first region 11 from the (m+n) memory cells connected with the main bit line BL1, the main bit line BL1 is set to the high potential, and the first sub-bit line bBL1 is set to the low potential. At the same time, in this embodiment, the second sub-bit line bBL2 connected with the plurality of (n) memory cells in the second region 12 is set to a potential substantially equal to that of the main bit line BL1.

When the potentials of the two sub-bit lines bBL1 and bBL2 for the one main bit line are set to different potentials in this manner, a potential difference is not generated between the pair of bit lines bBL1 and bBL2 with respect to the plurality of memory cells MC2 in the second region 12. Therefore, the cutoff current is not generated or a value of the cutoff current becomes very small in the select transistors Tr2 of the plurality of second memory cells MC2.

Therefore, in the semiconductor memory according to this embodiment, the number of non-selected cells in which the cutoff current is a concern with respect to the (m+n) memory cells connected with the main bit line BL1 is the number of the memory cells MC1 in the first region 11 where a potential different is produced between the pair of bit lines BL1 and bBL1, i.e., (m−1). Likewise, when reading data in a selected cell in the second region 12, the number of non-selected cells in which the cutoff current is a concern is the number of the second memory cells MC2 in the second region 12 where a potential difference is produced between the pair of bit lines BL1 and bBL2, i.e., (n−1).

As a result, according to this embodiment, a total amount of the cutoff current that provokes a fluctuation in the potential of the main bit line BL1 at the time of the read operation is reduced as compared with the conventional example.

As explained above, in the semiconductor memory according to this embodiment, since the number of memory cells connected with the bit line (sub-bit lines) set to the low potential is reduced with respect to the total number of memory cells connected with the bit line (a main bit line) set to the high potential in the read operation, thereby decreasing an influence of the cutoff current which leads to degradation in a read margin.

Therefore, according to the semiconductor memory based on the first embodiment of the present invention, degradation in the read margin of the semiconductor memory can be suppressed.

(2) Entire Structure
(2-1) Circuit Configuration

Figure 2:
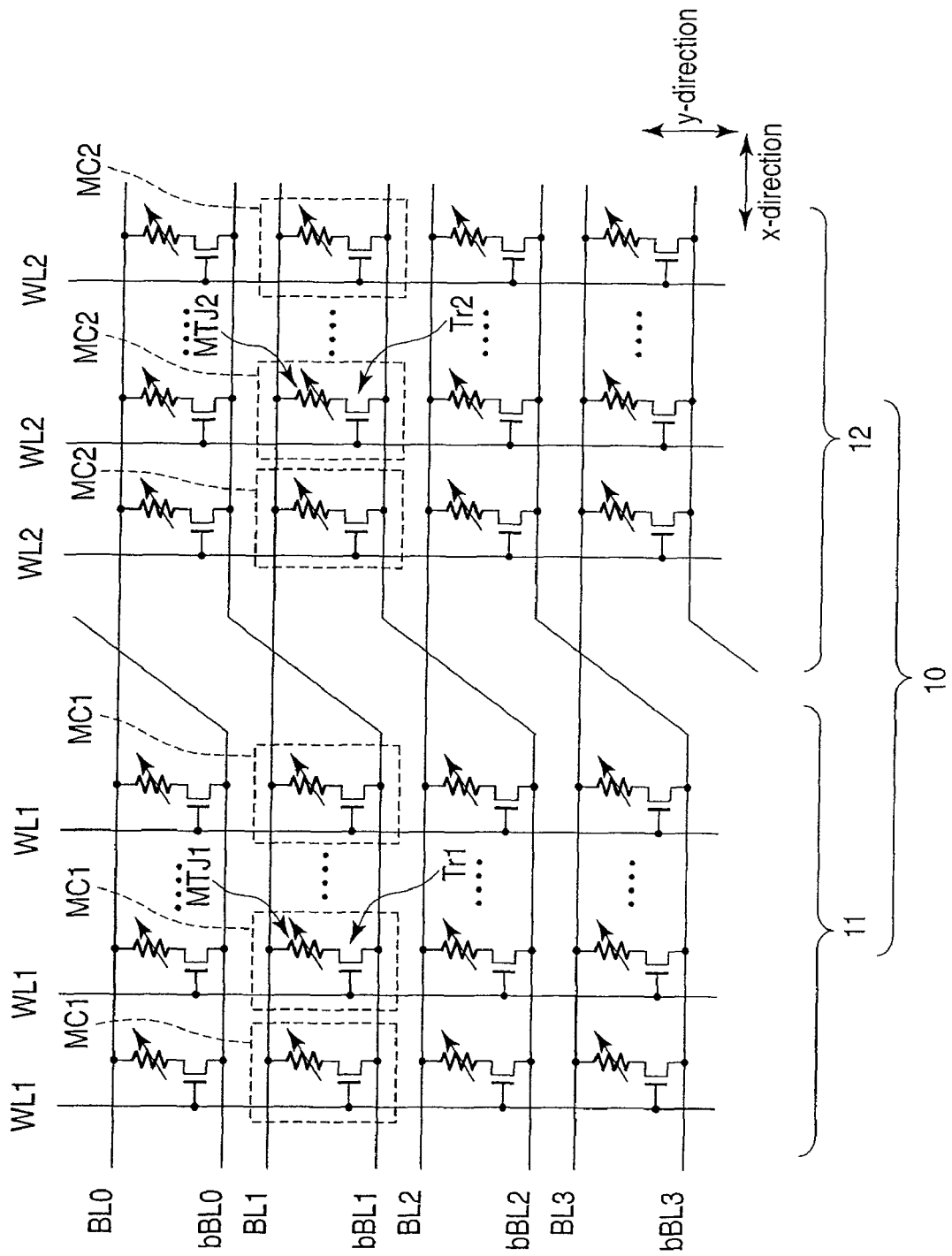
FIG. 2 is an equivalent circuit diagram of a memory cell array in the MRAM according to the first embodiment.

A circuit configuration of the semiconductor memory according to the first embodiment of the present invention will now be described hereinafter with reference to FIG. 2. FIG. 2 shows an equivalent circuit of a memory cell array 10 in the semiconductor memory according to this embodiment. As the semiconductor memory according to each embodiment of the present invention, the MRAM will be exemplified in the following description.

As shown in FIG. 2, a plurality of memory cells MC1 and MC2 are arranged in the form of an array in the memory cell array 10. Further, the plurality of first memory cells MC1 are arranged in a first region 11 in the memory cell array 10. The plurality of second memory cells MC2 are arranged in a second region 12 in the memory cell array 10. The first region 11 and the second region 12 are adjacent to each other in a direction of extension of bit lines (e.g., an x-direction) in the memory cell array 10.

Each of the first and second memory cells MC1 and MC2 is formed of a resistive memory element MTJ1 or MTJ2 functioning to store data and a selective switch element. The resistive memory element MTJ1 or MTJ2 is, e.g., a magnetoresistive effect element (an MTJ element). The selective switch element is, e.g., an MIS transistor (a select transistor).

It is to be noted that, like the memory cell MC1 or MC2 explained in conjunction with FIG. 1, one end (a second or fourth terminal) of the magnetoresistive effect element MTJ1 or MTJ2 is connected with one end (a source/drain) of a current path of the select transistor Tr1 or Tr2 in each memory cell MC1 or MC2.

A plurality of bit lines BL0 to BL3 and bBL0 to bBL3 are extended in, e.g., the x-direction. Each of first to fourth main bit lines BL1, BL2, BL3, and BL0 is a bit line that is used to supply a high potential to, e.g., a selected cell at the time of a read operation. On the other hand, each of first to fourth sub-bit lines bBL1, bBL2, bBL3, and bBL0 is a bit line that is used to supply a low potential to, e.g., a selected cell at the time of the read operation. Furthermore, the bit lines BL0 to BL3 and bBL0 to bBL3 are arranged in the memory cell array 10 in such a manner that the main bit lines BL0 to BL3 and the sub bit lines bBL0 to bBL3 become alternately adjacent to each other in a y-direction.

Word lines WL1 and WL2 are extended in a direction crossing (e.g., the y-direction) the direction of extension of the bit lines BL0 to BL3 and bBL0 to bBL3. The plurality of first word lines WL1 are provided in the first region 11, and the plurality of second word lines WL2 are provided in the second region 12.

In the first region 11, the first main bit line BL1 and the first sub-bit line bBL1 form one pair of bit lines. A connection relationship between this pair of bit lines BL1 and bBL1 and the plurality of first memory cells MC1 in the first region 11 is as follows.

The plurality of first memory cells MC1 arranged in the x-direction are connected with the pair of bit lines BL1 and bBL1 in common. Moreover, one end of the first magnetoresistive effect element MTJ1 in each memory cell MC1 is connected with the main bit line BL1, and one end of the current path of the first select transistor Tr1 in each memory cell MC1 is connected with the first sub-bit line bBL1.

Additionally, in the first region 11, one end of the magnetoresistive effect element MTJ1 of the memory cell MC1 is connected with the main bit line BL2 and one end of the current path of the select transistor Tr1 is connected with the sub-bit line bBL2 in the pair of bit lines BL2 and bBL2 adjacent to the pair of bit lines BL1 and bBL1 in the y-direction.

Likewise, in each of the pair of bit lines BL0 and bBL0 and the pair of bit lines BL3 and bBL3, one end of the magnetoresistive effect element MTJ1 is connected with the main bit line BL0 or BL3 and one end of the current path of the select transistor Tr1 is connected with the sub-bit line bBL0 or bBL3.

Further, in the first region 11 of the memory cell array 10, one word line WL1 is shared by the plurality of memory cells MC1 arranged in the y-direction, and each word line WL1 is connected with a gate of the select transistor Tr1 constituting each memory cell MC1.

The plurality of memory cells MC2 provided in the second region 12 of the memory cell array 10 are connected with the respective bit lines BL0 to BL3 and bBL0 to bBL3 extended from the first region 11 to the second region 12 as follows.

One end of the second magnetoresistive effect element MTJ2 constituting each second memory cell MC2 is connected with the bit line BL1 connected with the magnetoresistive effect element MTJ1 constituting each first memory cell MC1.

Furthermore, one end of the current path of the select transistor Tr2 constituting each second memory cell MC2 is connected with the second sub-bit line bBL2. The second sub-bit line bBL2 and the first main bit line BL1 form a pair of bit lines in the second region 12 in this manner, whereas the sub-bit line bBL2 and the second main bit line BL2 form a pair of bit lines in the first region 11.

The sub-bit line bBL1 that forms the pair of bit lines with the main bit line BL1 with respect to the plurality of memory cells MC1 in the first region 11 forms the pair of bit lines with the fourth main bit line BL0 with respect to the plurality of memory cells MC2 in the second region 12.

As explained above, in the memory cell array 10 of the MRAM according to the first embodiment of the present invention, ends on one side (the first and third terminals) of the magnetoresistive effect elements MTJ1 and MTJ2 are connected with the same main bit lines BL0 to BL3 in the first and second memory cells MC1 and MC2 in the first and second regions 11 and 12 connected with the same main bit lines BL0 to BL3 in common, and ends on one side of the current paths of the select transistors Tr1 to Tr2 are connected with the sub-bit lines bBL0 to bBL4 that differ depending on the first memory cells MC1 and the second memory cells MC2.

As a result, potential control can be performed with respect to the plurality of memory cells MC1 and MC2 in the first and second regions 11 and 12 connected with the same main bit lines BL0 to BL3 in common by using the sub-bit lines bBL0 to bBL3 that differ depending on the first memory cells MC1 in the first region 11 and the second memory cells MC2 in the second region 12.

Therefore, in the plurality of memory cells connected with the same main bit lines and the different sub-bit lines, setting the sub-bit line that is not connected with a selected cell to the same potential as that of the main bit line enables suppressing generation of a cutoff current from non-selected cells.

Therefore, according to the MRAM of the first embodiment of the present invention, degradation in a read margin can be suppressed.

(2-2) Structure

A structure of the MRAM according to the first embodiment of the present invention will now be explained with reference to FIGS. 3 to 5.

Figure 3:
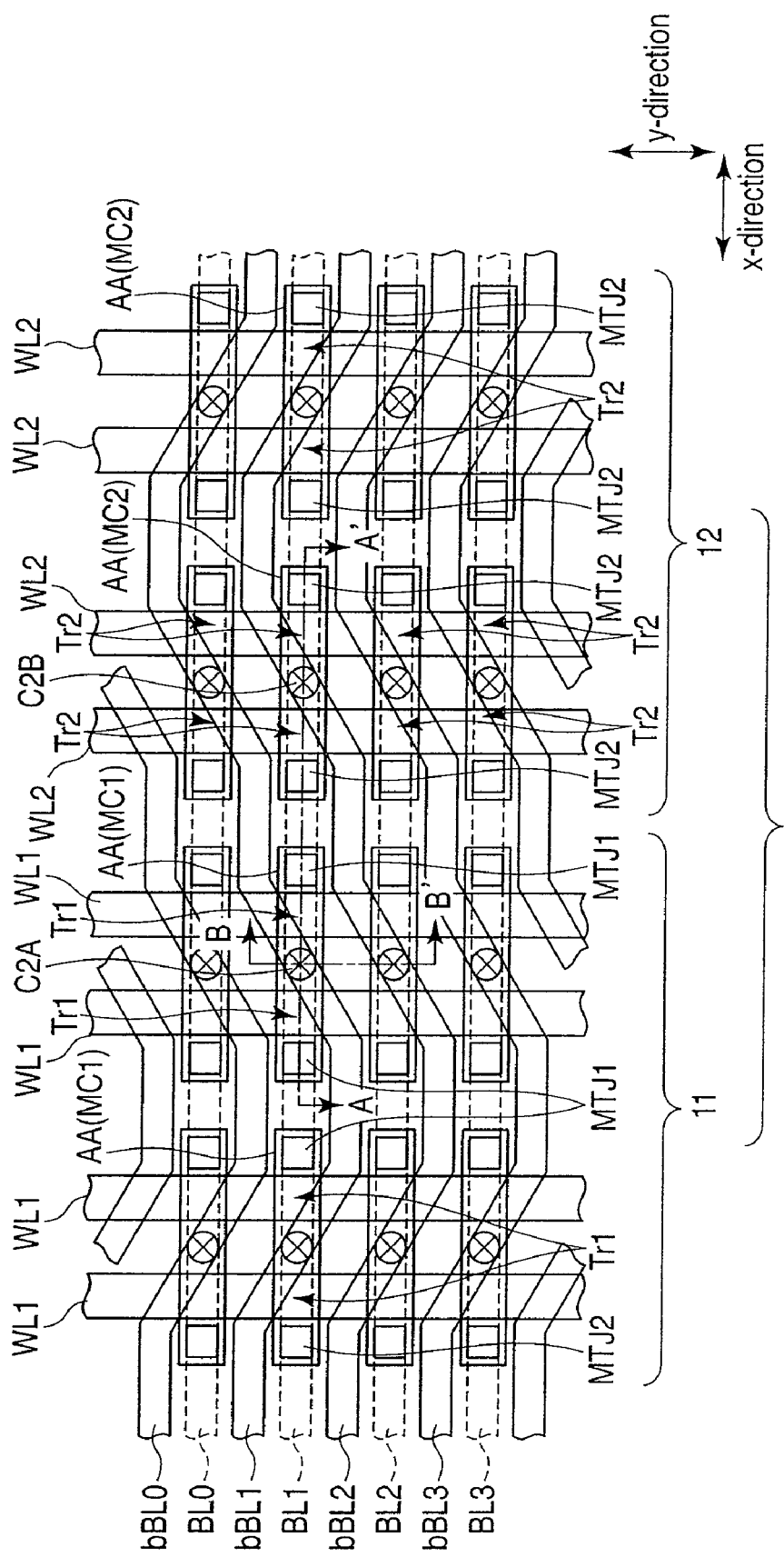
FIG. 3 is a plan view showing a layout of the memory cell array in the MRAM according to the first embodiment.
Figure 4A:
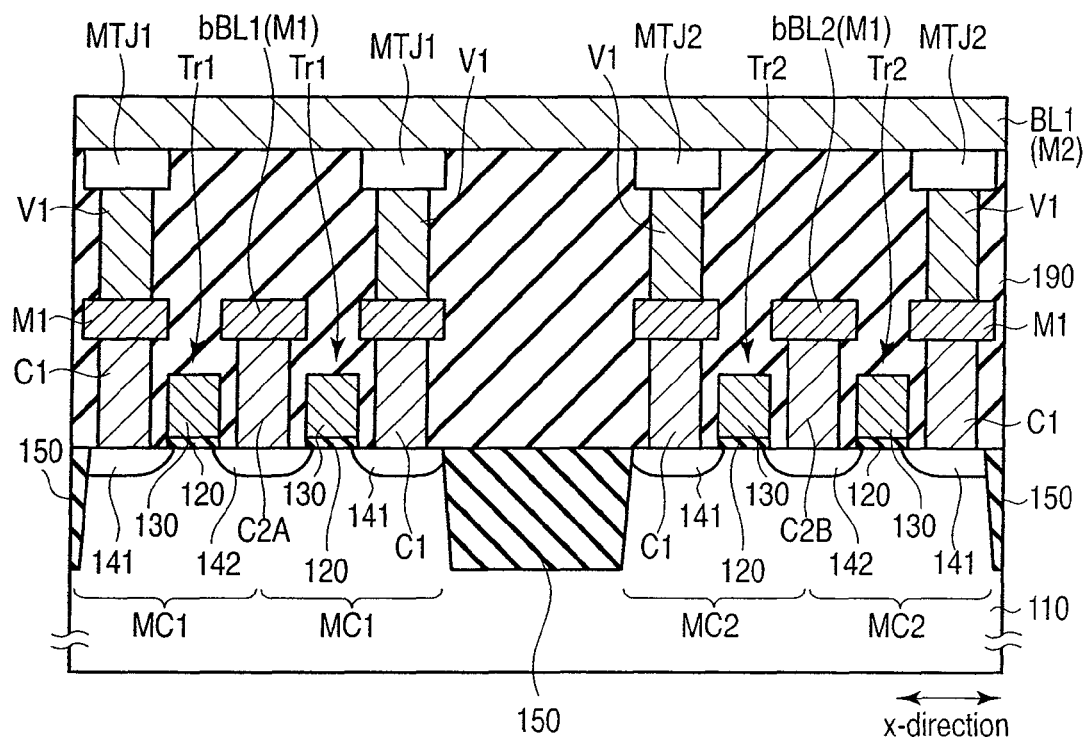
FIG. 4A is a cross-sectional view taken along a line A-A' in FIG. 3.
Figure 4B:
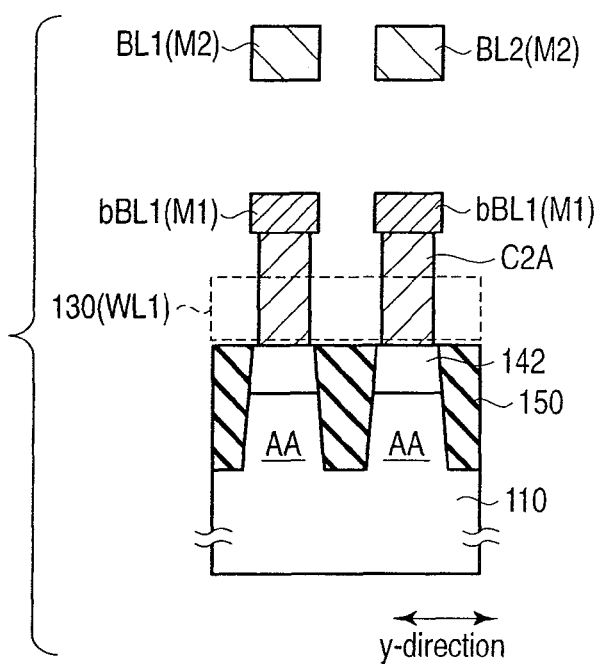
FIG. 4B is a cross-sectional view taken along a line B-B' in FIG. 3.

FIG. 3 shows a layout of the memory cell array 10 in the MRAM according to the first embodiment of the present invention. FIG. 4A shows a cross-sectional structure taken along a line A-A' in FIG. 3, and FIG. 4B shows a cross-sectional structure taken along a line B-B' in FIG. 3. It is to be noted that an interlayer insulating film 190 is omitted in FIG. 4B to clarify members.

As shown in FIGS. 3, 4A, and 4B, a plurality of active regions AA are provided in a surface region of a semiconductor substrate 110 of the memory cell array 10. An isolation region is provided in the semiconductor substrate surface region to surround the periphery of these active regions AA. One active region AA has, e.g., a square island shaped structure, and the respective active regions AA are electrically isolated by an isolation insulating film 150 buried in the isolation region.

The plurality of bit lines BL0 to BL3 and bBL0 to bBL3 are extended in, e.g., the x-direction. For example, the two bit lines BL1 and bBL1 forming one pair of bit lines like the main bit line BL1 and the sub-bit line bBL1 are provided in, e.g., different interconnection layer (interconnection level). In this embodiment, a bit line provided on the interlayer insulating film 190 like the main bit line BL1 depicted in FIGS. 4A and 4B is also called an upper bit line, and a bit line provided in a layer below the upper bit line like the sub-bit line bBL1 depicted in FIGS. 4A and 4B is also called a lower bit line. It is to be noted that the upper bit lines BL0 to BL3 are indicated by broken lines.

Each of the first to fourth upper bit lines (the main bit lines) BL0 to BL3 has, e.g., a linear shape and is extended in the x-direction. The upper bit lines BL0 to BL3 are provided above the semiconductor substrate 110 to be vertically superimposed on the active regions AA through the interlayer insulating film 190.

Each of the first to fourth lower bit lines (the sub-bit lines) bBL0 to bBL3 is extended in the x-direction like the upper bit lines BL0 to BL3. However, each of the lower bit lines bBL0 to bBL3 has a zigzag shape in such a manner that it is not vertically superimposed on the magnetoresistive effect element MTJ1 or MTJ2 provided in each active region AA, and it is arranged above the semiconductor substrate 100. Each of the zigzag lower bit lines bBL0 to bBL3 is formed of linear portions and oblique portions, each linear portion is provided on the isolation region, and each oblique portion is extended in an oblique direction within an x-y plane to connect two linear portions. The oblique portions of the lower bit lines bBL0 to bBL3 vertically cross the linear upper bit lines BL0 to BL3.

The plurality of word lines WL1 and WL2 are extended in, e.g., the y-direction. The plurality of word lines WL1 and WL2 are provided on the semiconductor substrate 110 to cross the plurality of active regions AA arranged in the y-direction. In the example of the memory cell array 10 depicted in FIGS. 3, 4A, and 4B, the two word lines WL1 and WL2 cross the respective active regions AA.

As explained above, the first memory cells MC1 and the second memory cells MC2 are provided in the first region 11 and the second region 12, respectively. The memory cells MC1 and MC2 are formed in the active regions AA.

The first magnetoresistive effect element MTJ1 constituting the first memory cell MC1 is provided in, e.g., each active region AA below the upper bit lines BL0 to BL3. In the example of the memory cell array 10 depicted in FIGS. 4A and 4B, when the upper ends of the magnetoresistive effect elements MTJ1 directly come into contact with the upper bit lines BL0 to BL3, the magnetoresistive effect elements MTJ1 are electrically connected with the upper bit lines (the main bit lines) BL0 to BL3.

FIG. 5 shows a cross-sectional structure of the magnetoresistive effect element MTJ1.

For example, as shown in FIG. 5, the magnetoresistive effect element MTJ1 has a magnetization invariance layer 10A in which a magnetizing direction is fixed, a magnetization free layer 14A in which a magnetizing direction is variable, and a non-magnetic layer (e.g., an insulating layer) 12A sandwiched between the magnetization invariance layer 10A and the magnetization free layer 14A. The magnetoresistive effect element MTJ1 is, e.g., an element utilizing a magnetic tunnel effect.

In this embodiment, two magnetoresistive effect elements MTJ1 are provided in one active region AA in the first region 11. Further, there is provided a layout in which two word lines WL1 run between two magnetoresistive effect elements MTJ1 provided in one active region AA.

The first select transistor Tr1 constituting the first memory cell MC1 is provided at an intersection of the word line WL1 and the active region AA in the first region AA. That is, the example of the memory cell array 10 depicted in FIGS. 3, 4A, and 4B has a structure in which two select transistors Tr1 are provided in one active region AA.

The first select transistor Tr1 has a gate insulating film 120 on the surface of the semiconductor substrate 110 (the active region AA), a gate electrode 130 provided on the gate insulating film 120, and two diffusion layers 141 and 142 (which will be referred to as source/drain diffusion layers hereinafter) that function as source/drain regions provided in the semiconductor substrate 10.

The gate insulating film 120 of the first select transistor Tr1 is provided on a channel region between the two source/drain diffusion layers 141 and 142.

The gate electrode 130 of the first select transistor Tr1 is extended in the y-direction, and functions as the word line WL1. That is, the gate electrode 130 of the select transistor Tr1 is shared by the plurality of select transistors Tr1 adjacent to each other in the y-direction.

The one source/drain diffusion layer 141 of the first select transistor Tr1 is provided in the semiconductor substrate 110 below the magnetoresistive effect element MTJ1. A contact plug C1 is provided on the source/drain diffusion layer 141. The contact plug C1 is connected with the lower end of the magnetoresistive effect element MTJ1 through an intermediate interconnection M1 and a via plug V1. As a result, in the first memory cell MC1, one end of the first magnetoresistive effect element MTJ1 is connected with one end of the current path of the first select transistor Tr1. It is to be noted that the via plug V1 also functions as a lower electrode of the magnetoresistive effect element MTJ1.

The other source/drain diffusion layer 142 of the select transistor Tr1 is provided in the semiconductor substrate 110 between the two word lines WL1. The source/drain diffusion layer 142 is shared by the two select transistors Tr1 provided in the single active region AA. This shared source/drain diffusion layer 142 functions as a shared node, and is connected with the oblique portion of the lower bit line (the sub-bit line) bBL1 through a contact plug C2A provided on the diffusion layer 142.

In the second region 12 adjacent to the first region 11 in the y-direction, a structure of the second memory cell MC2 provided in the second region 12 is substantially the same as that of the memory cell MC1 provided in the first region 11. This structure is specified below.

In the second region 12, the two second memory cells MC2 are provided in the single active region AA. That is, the two second magnetoresistive effect elements MTJ2 and the two second select transistors Tr2 are provided in the single active region AA.

The second magnetoresistive effect element MTJ2 is provided in the active region AA below each of the upper bit lines BL0 to BL3. The second magnetoresistive effect element MTJ2 is directly in contact with each of the upper bit lines BL0 to BL3.

The second select transistor Tr2 is provided at an intersection of the active region AA and the second word line WL2 in the second region 12. It is to be noted that the second region 12 likewise has a layout in which the two second word lines WL2 are sandwiched between the two magnetoresistive effect elements MTJ2 provided below each of the upper bit lines BL0 to BL3.

The second select transistor Tr2 has the two source/drain diffusion layers 141 and 142 in the semiconductor substrate 100 and the gate electrode 130 on the gate insulating film 120.

The gate electrode 130 of the second select transistor Tr2 functions as the second word line extended in the y-direction and is shared by the plurality of second select transistors Tr2 which are adjacent to each other in the y-direction.

The one source/drain diffusion layer 141 of the second select transistor Tr2 is provided in the semiconductor substrate 110 below the second magnetoresistive effect element MTJ2. The contact plug C1 is provided on the source/drain diffusion layer 141. One end of the current path of the select transistor Tr2 is connected with one end of the second magnetoresistive effect element MTJ2 through this contact plug C1, the intermediate interconnection M1, and the via plug V1. The other source/drain diffusion layer 142 of the second select transistor Tr2 is provided in the semiconductor substrate 110 between the two word lines WL2. The source/drain diffusion layer 142 is shared by the two select transistors Tr2 provided in the same active region AA. This shared source/drain diffusion layer 142 is connected with the lower bit line (the sub-bit line) bBL2 through a contact plug C2B provided on this diffusion layer 142.

Like this embodiment, the two memory cells MC1 are provided in the one active region AA, and the select transistors Tr1 included in the respective two memory cells MC1 share the single source/drain diffusion layer 142. As a result, a cell size is reduced. In this embodiment, a cell size of one memory cell is $6F^2$ (F is a feature size).

In the MRAM according to the embodiment of the present invention, the plurality of memory cells MC1 and MC2 in the first and second regions 11 and 12 aligned in the same straight line in the x-direction have the magnetoresistive effect elements MTJ1 and MTJ2 whose ends on one side are connected with the same upper bit line (e.g., the bit line BL1). Each of the upper bit lines BL0 to BL3 functions as a main bit line through which a high potential is supplied to a selected cell at the time of a read operation.

On the other hand, in the plurality of memory cells MC1 and MC2 in the first and second regions 11 and 12 aligned in the same straight line in the x-direction, the source/drain diffusion layers (the shared nodes) of the select transistors Tr1 and Tr2 are connected with the different lower bit lines (e.g., the bit lines bBL1 and bBL2). In this embodiment, each of the lower bit lines bBL0 to bBL3 functions as a sub-bit line through which a low potential is supplied to a selected cell at the time of the read operation.

In the first region 11, the upper bit line BL1 serving as the first main bit line and the lower bit line bBL1 serving as the first sub-bit line form a pair of bit lines, and they are respectively connected with the plurality of first memory cells MC1.

In the second region 12, the lower bit line bBL2 becomes the sub-bit line with respect to the upper bit line BL1 serving as the first main bit line, and is connected with the plurality of second memory cells MC2.

This lower bit line bBL2 is the sub-bit line bBL2 of the pair of bit lines BL2 and bBL2 which are adjacent to the pair of bit lines BL1 and bBL1 in the y-direction in the first region 11. That is, the lower bit line (the sub-bit line) bBL2 in the first region 11 is connected with the memory cell MC1 connected with the upper bit line (the main bit line BL2).

In this manner, one lower bit line (the sub-bit line) is led out in an oblique direction within the x-y plane near a boundary between the first region 11 and the second region 12. And this lower bit line forms a pair of bit lines with one upper bit line in the first region 11 and forms a pair of bit lines with the other upper bit line that is adjacent to the one upper bit line in the y-direction in the second region 12 with respect to two upper bit lines (the main bit lines) which are adjacent to each other in the y-direction in the first and second regions 11 and 12.

It is to be noted that each of the upper bit lines BL0 to BL3 has a linear shape and each of the lower bit lines bBL0 to bBL4 has a zigzag shape in the example depicted in FIG. 3. In this case, for example, the oblique portion of the second lower bit line bBL2 vertically crosses the second upper bit line BL2 in the first region 11 and vertically crosses the first upper bit line BL1 in the second region 12.

With the above-explained structure, in the MRAM according to this embodiment, there can be configured the memory cell array 10 in which the first and second memory cells MC1 and MC2 provided in the first and second regions 11 and 12 are connected with each of the same main bit lines BL0 to BL3 in common. And the first and the second memory cells MC1 and MC2 connected with each of the same main bit lines are connected with the different sub-bit lines bBL0 to bBL4.

It is to be noted that each of the magnetoresistive effect element MTJ1 or MTJ2 may have a single junction structure having one non-magnetic layer or a double junction structure having two non-magnetic layers. The magnetoresistive effect element having the single junction structure may be of a bottom pin type in which the magnetization free layer is arranged on the upper bit line side and the magnetization invariance layer is arranged on the semiconductor substrate 1 side or may be of a top pin type in which the magnetization invariance layer is arranged on the upper bit line side and the magnetization free layer is arranged on the semiconductor substrate 1 side. The magnetoresistive effect element having the double junction structure has a first magnetization invariance layer, a second magnetization invariance layer, a memory layer provided between the first and second magnetization invariance layer, a first non-magnetic layer provided between the first magnetization invariance layer and the magnetization free layer, and a second non-magnetic layer provided between the second magnetization invariance layer and the magnetization free layer.

Moreover, the planar shape of each of the magnetoresistive effect elements MTJ1 to MTJ10 is not restricted to the illustrated square shape. For example, a rectangular shape, an elliptic shape, a circular shape, a hexagonal shape, a rhombic shape, a parallelogram shape, a cross-like shape, or a bean-like (concave) shape can be adopted as the planar shape of the magnetoresistive effect element. Additionally, a magnetizing direction of each of the magnetization free layer and the magnetization invariance layer in the magnetoresistive effect elements MTJ1 to MTJ10 may be a vertical magnetization type in which the magnetizing direction is vertical to a film surface or a parallel magnetization type that the magnetizing direction is parallel to the film surface. In case of the magnetoresistive effect element which is of the parallel magnetization type, a diamagnetic layer that is used to fix the magnetizing direction of the magnetization invariance layer may be provided on a surface facing a surface of the magnetization invariance layer that is in contact with the non-magnetic layer.

It is to be noted that the interconnection M1 and the lower bit lines bBL0 to bBL3 are, e.g., interconnections which are simultaneously formed in a manufacturing process of the MRAM according to this embodiment. Further, the bit lines BL0 to BL3 and bBL0 to bBL3 are formed of a metal material, e.g., aluminum (Al) or copper (Cu). Each of the word lines WL1 and WL2 is formed of, e.g., a polysilicon film, a silicide film, or a metal material.

(3) Operation

An operation of the MRAM according to the first embodiment of the present invention will now be described with reference to FIGS. 6A to 9.

(3-1) Principle of Operation

Write/read principles of the MRAM according to this embodiment will now be explained. In the MRAM, a tunneling magneto resistive effect is utilized to discriminate data. The tunneling magneto resistive effect means that the tunnel resistance value of the non-magnetic layer (a tunnel barrier film) sandwiched between the ferromagnetic layers changes according to whether the direction of magnetization the magnetization invariance layer (a reference layer) and the magnetization free layer (a storage layer) in the magnetoresistive effect element are parallel or anti-parallel. The resistance value of the magnetoresistive effect element becomes low when the magnetizing directions of the magnetization invariance layer and the magnetization free layer are parallel, and a resistance value of the magnetoresistive effect element becomes high when the magnetizing directions are anti-parallel. Data "1" or data "0" is discriminated depending on the level of the resistance value of this magnetoresistive effect element.

As a write mode of the MRAM according to this embodiment, for example a spin transfer magnetization reversal technology is adopted. Magnetization reversal based on spin transfer is carried out by injecting an electron subjected to spin polarization by using a magnetic moment of the magnetization invariance layer (which will be referred to as a spin polarized electron) into the magnetization free layer and subjecting the magnetization free layer to magnetization reversal based on movement of a spin angular momentum due to an exchange interaction of the spin polarized electron and an electron in the magnetization free layer. That is, a write current is flowed from the magnetization invariance layer to the magnetization free layer or from the magnetization free layer to the magnetization invariance layer to set the magnetizing direction of the magnetization free layer and the magnetizing direction of the magnetization invariance layer to an antiparallel state (e.g., data "0") or a parallel state (e.g., data "1"), thereby writing data.

In this manner, a potential difference is applied to both the ends of the magnetoresistive effect element, a write current that is equal to or above a current having a magnetization reversal threshold value is flowed to reverse the magnetizing direction of the magnetization free layer, the magnetizing directions of the magnetization invariance layer and the magnetization free layer are set to be parallel or anti-parallel in accordance with the direction of flow of the write current, and the resistance value of the magnetoresistive effect element is changed, thereby writing data "1" or "0".

Furthermore, at the time of a read operation of the MRAM according to this embodiment, a read current is flowed from one bit line connected with a selected cell to the other bit line. Moreover, a tunnel resistance value of the magnetoresistive effect element is discriminated based on the read current, thereby reading data in the selected cell.

The read operation of the MRAM according to the first embodiment of the present invention will now be explained hereinafter.

(3-2) Read Operation

Figure 6B:
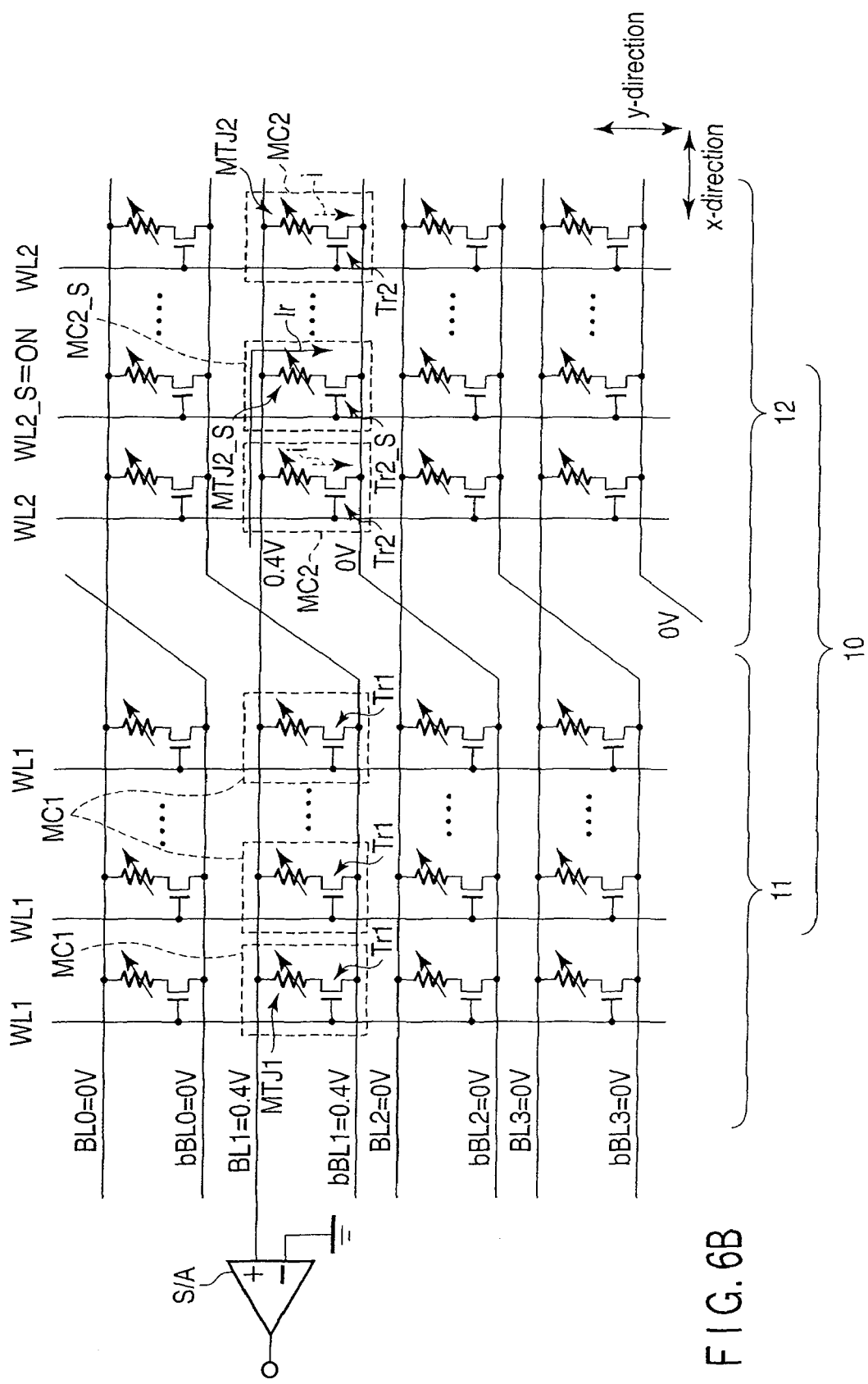
FIG. 6B is a view for explaining the read operation of the MRAM according to the first embodiment.

The read operation of the MRAM according to this embodiment will now be explained with reference to FIGS. 6A and 6B. FIGS. 6A and 6B are schematic views for explaining the read operation of the MRAM according to the first embodiment of the present invention.

In the MRAM according to this embodiment, for example, a sense amplifier S/A is connected with a main bit line (e.g., the main bit line BL1) set to a high potential in a pair of bit lines, and the sense amplifier S/A senses a signal from a memory cell selected for reading (a selected cell) as data stored in the magnetoresistive effect element. A potential/current is supplied to the main bit line from a voltage source or a current source that is additionally provided.

Specifically, when a read current Ir flows through the selected cell toward a sub-bit line forming a pair with the main bit line that is connected with the selected cell, the potential of the main bit line fluctuates in accordance with the tunnel resistance value of the magnetoresistive effect element in the selected cell. The sense amplifier S/A detects the amount of this fluctuation and discriminates data stored in the selected cell in accordance with this fluctuation amount.

A description will be first given as to a case where one first memory cell in the first region 11 is selected for reading with reference to FIG. 6A. In the example depicted in FIG. 6A, a first memory cell MC1_S in the first region 11 connected with the first main bit line BL1 is a memory cell selected for reading.

A word line WL1_S connected with the selected cell MC1_S in the first region 11 is first set to a high potential. As a result, a select transistor Tr1_S in the selected cell MC1_S is turned on. It is to be noted that a select transistor in each non-selected cell MC1 belonging to the word line WL1_S connected with the selected cell MC1_S is also turned on. Further, since non-selected word lines WL1 and WL2 are set to a low potential, select transistors Tr1 and Tr2 connected with the non-selected word lines WL1 and WL2 are turned off.

Then, potentials of the pair of bit lines BL1 and bBL1 connected with the selected cell MC1_S are controlled. The selected first main bit line (the selected bit line) BL1 is set to a high potential (e.g., 0.4 V). As explained above, one end of the magnetoresistive effect element MTJ1_S in the selected cell MC1_S is connected with the main bit line BL1. Furthermore, ends of magnetoresistive effect elements MTJ1 and MTJ2 of the first and second memory cells (non-selected cells) MC1 and MC2 in the first and second regions 11 and 12 are connected with the main bit line BL1.

The first sub-bit line bBL1 is set to a low-potential (e.g., 0 V). This sub-bit line bBL1 forms a bit line pair with the main bit line BL1 in the first region 11 and is connected with ends of the current paths of the select transistors Tr1 and Tr2 constituting the memory cells MC1 and MC1_S in the first region.

Based on a potential difference between this pair of bit lines BL1 and bBL1 and the ON state of the select transistor Tr1_S in the selected cell MC1_S, a read current Ir flows through the selected cell MC1_S.

The read current Ir flows through the magnetoresistive effect element MTJ1_S and the current path (a channel) of the select transistor Tr1_S having entered the ON state in the selected cell MC1_S.

When the read current Ir flows through the magnetoresistive effect element MTJ1_S, a potential of the first main bit line BL1 fluctuates. At this time, since a tunnel resistance value of the magnetoresistive effect element MTJ1_S differs depending on data "1" and data "0", a fluctuation amount of the potential of the main bit line differs in accordance with data stored in the selected cell MC1_S. The sense amplifier S/A connected with the selected bit line BL1 detects this fluctuation amount, thereby judging whether data stored in the selected cell MC1_S is "1" or "0".

As explained above, in the second region 12, a second sub-bit line bBL2 different from the first sub-bit line bBL1 forms a bit line pair with the main bit line BL1 with respect to the second memory cell MC2. The second sub-bit line bBL2 is connected with a select transistor Tr2 constituting the second memory cell MC2.

At the time of the read operation with respect to the selected cell MC1_S in the first region 11, this sub-bit line bBL2 is set to a potential (e.g., 0.4 V) substantially equal to that of the main bit line BL1.

As explained above, at the time of the read operation with respect to the selected cell MC1_S in the first region 11 connected with the first main bit line, the MRAM according to this embodiment can perform potential control using the sub-bit line bBL2, which differs from the sub-bit line connected with the selected cell MC1_S with respect to the plurality of second memory cells MC2 connected with the first main bit line BL1.

As a result, a potential difference between the main bit line BL1 and the sub-bit line bBL2 is reduced, a cutoff current caused due to the second select transistor Tr2 is not generated or becomes very small in the plurality of memory cells (non-selected cells) MC2 in the second region 12 which are connected with this pair of bit lines BL1 and bBL2.

Therefore, even if the plurality of memory cells MC1 and MC2 in the first and second regions 11 and 12 are connected with the main bit line BL1 selected for reading, a cutoff current (a leak current) i that fluctuates a potential with respect to the main bit line BL1 is a current caused due to cutoff resistance properties of the select transistor in each non-selected cell MC1 in the first region 11 alone. Accordingly, the total of cutoff current that adversely affects sensing (reading data) of the sense amplifier S/A is reduced, and a potential of the selected bit line (the main bit line BL1 in this example) at the time of the read operation is fluctuated.

Therefore, as shown in FIG. 6A, in the read operation of the selected cell MC1_S in the first region 11, degradation in a read margin caused due to the cutoff current can be suppressed.

It is to be noted that the potential of the bit line BL1 that is set to a high potential is set to 0.4 V in this embodiment, but the present invention is not restricted to this value, and a potential set to a value that can avoid erroneous writing due to the read current, e.g., a value falling within the range of 0.08 V to 0.5 V can suffice.

An example where a single second memory cell in the second region 12 is selected for reading will now be described with reference to FIG. 6B. In the example depicted in FIG. 6B, it is assumed that a memory cell MC2_S in the second region 12 is a memory cell selected for reading. A read operation of the selected cell MC2_S in the second region 12 is substantially the same as the read operation with respect to the memory cell MC1_S in the first region 11.

First, as shown in FIG. 6B, a word line WL2_S is set to a high potential, and a select transistor Tr2_S in the memory cell MC2_S is turned on.

Then, potentials of a pair of bit lines BL1 and bBL2 connected with the selected cell M2_S are controlled. A potential of the main bit line (a selected bit lie) BL1 is set to a high potential (e.g., 0.4 V), and the sub-bit line bBL2 is set to a low potential (e.g., 0 V). As a result, a read current Ir flows through the selected cell MC2_S.

As shown in FIG. 6B, a plurality of first memory cells (non-selected cells) MC1 in the first region 11 are connected with the same first main bit line BL1 as that of the selected cell MC2_S in the second region 12. However, in this embodiment, the first memory cell MC1 is connected with a first sub-bit line bBL1, differing from an arrangement in which the selected cell MC2_S is connected with the second sub-bit line bBL2.

In the read operation with respect to the selected cell MC2_S connected with the first main bit line BL1, this sub-bit line bBL1 is set to a potential (e.g., 0.4 V) substantially equal to a potential of the main bit line BL1. Since the potential of the main bit line BL1 is substantially equal to that of the sub-bit line bBL1, a cutoff current is not generated or an intensity of the cutoff current is reduced in the memory cell MC1 connected with the pair of bit lines BL1 and bBL1.

Therefore, as shown in FIG. 6B, in the plurality of memory cells MC1 and MC2 connected with the selected bit line BL1, a cutoff current of a select transistor that affects a fluctuation in potential of the bit line BL1 is a cutoff current from each non-selected cell MC2 in the second region 12 alone.

Therefore, the total of the cutoff currents that fluctuate a potential of the selected bit line can be reduced.

Accordingly, in the example depicted in FIG. 6B, degradation in a read current caused due to the cutoff current can be suppressed in the read operation of the selected cell MC2_S in the second region 12.

As explained above, the MRAM according to the first embodiment of the present invention is characterized in that the plurality of first and second memory cells MC1 and MC2 constituting the memory cell array 10 are connected with the bit line (the main bit line) BL1 that supplies a high potential to a cell selected for reading in common and the first memory cell MC1 and the second memory cell MC2 are connected with the different bit lines (the sub-bit lines) bBL1 and bBL2 that supply a low potential to the cell selected for reading.

Adopting such a configuration enables individually controlling potentials of the first sub-bit line bBL1 and the second sub-bit line bBL2 each forming the bit line pair with the main bit line BL1.

Furthermore, setting the potential of one of the first sub-bit line bBL1 and the second sub-bit line bBL2 to be equal to that of the main bit line (the selected bit line) BL1 in accordance with the region 11 or 12 where the selected cell is placed enables preventing a cutoff current from being generated from each non-selected cell connected to a portion between the main bit line and the sub-bit line having the same potential.

Moreover, as explained above, in the MRAM according to this embodiment, even if a size of the select transistor Tr is reduced due to miniaturization of a cell size and a cutoff current (a leak current) caused due to a short channel effect becomes prominent, controlling a potential of the sub-bit line enables reducing noise with respect to the sense amplifier (the selected bit line). In other words, in the MRAM according to this embodiment, since the cutoff current can be suppressed by an electrical technique based on control over the potential of the sub-bit line, the size of the select transistor does not have to be increased in order to avoid generation of the cutoff current. As a result, the size of each memory cell can be reduced, and a memory capacity of the MRAM can be increased.

Therefore, according to the MRAM of the first embodiment of the present invention, as shown in FIGS. 6A and 6B, degradation in a read margin due to the cutoff current from each non-selected cell can be suppressed.

[2] Second Embodiment

An MRAM according to a second embodiment of the present invention will now be described with reference to FIGS. 7A and 7B. This embodiment relates to a read operation of the MRAM. The read operation described in the first embodiment will be referred to as a first read operation, and a read operation which will be explained in this embodiment will be referred to as a second read operation.

In the second read operation according to this embodiment, a set potential of a non-selected bit line in the read operation is different from a set potential of a non-selected bit line in the first read operation. It is to be noted that a circuit configuration of the memory cell array 10 in the MRAM according to this embodiment is the same as that of the MRAM according to the first embodiment, thereby omitting an explanation thereof. Additionally, in the second read operation, a detailed description of an operation in the second read operation that is common to the first read operation will be omitted.

Figure 7A:
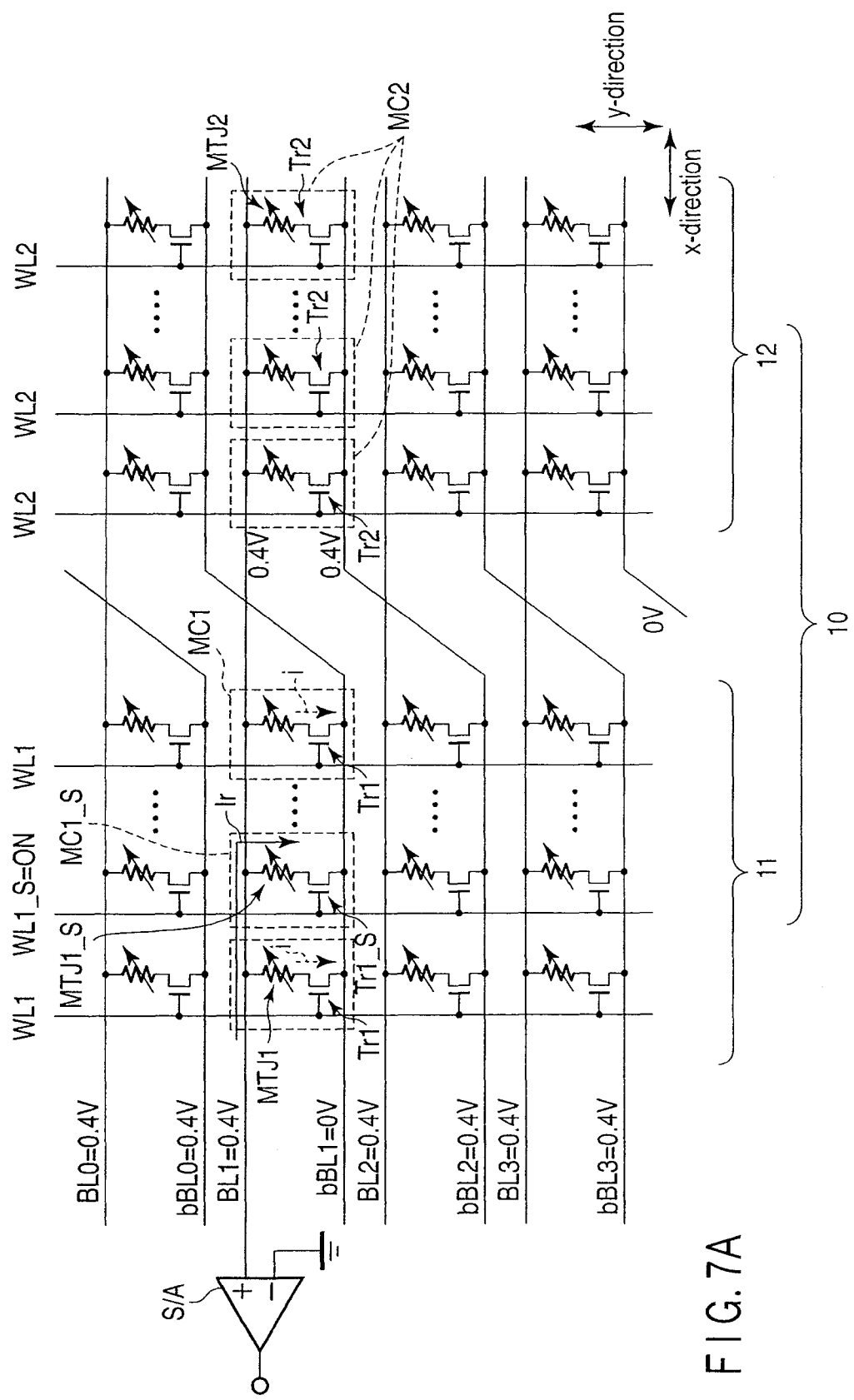
FIG. 7A is a view for explaining a read operation of an MRAM according to a second embodiment.

FIGS. 7A and 7B are schematic views for explaining the read operation of the MRAM according to the second embodiment of the present invention.

An example where a memory cell MC1_S in a first region 11 is selected for reading will be first described with reference to FIG. 7A.

In the example depicted in FIG. 7A, a word line WL1_S connected with a selected cell MC1_S is set to a high potential, and a selected transistor Tr1_S in the selected cell M1_S is turned on.

Then, in a pair of bit lines BL1 and bBL1 connected with the selected cell MC1_S, a potential of the main bit line BL1 is set to a high potential (e.g., 0.4 V), and a potential of the sub-bit line bBL1 is set to a low potential (e.g., 0 V). As a result, data is read from a selected cell MC1_S.

At this time, in a plurality of second memory cells (non-selected cells) MC2 connected with the main bit line BL1 that is common to the selected cell MC1_S, a potential of a sub-bit line bBL2 connected with the memory cells MC2 is set to a potential (e.g., 0.4 V) that is substantially equal to that of the main bit line BL1. As a result, a cutoff current can be prevented from being generated from the second memory cells MC2.

Further, as shown in FIG. 7A, in the second read scheme of the MRAM according to this embodiment, a potential is also supplied to a plurality of main bit lines (non-selected bit lines) BL0, BL2, and BL3 and sub-bit lines (non-selected bit lines) bBL1, bBL2, and bBL3 which are not connected with the selected cell MC1_S. The potential supplied to these pairs of non-selected bits is set to a potential (e.g., 0.4 V) substantially equal to a potential of the selected bit line (the first main bit line BL1 in this example).

When the potential is supplied to the bit lines excluding the thus selected pair of bit lines, the bit lines are already charged at the time of executing the read operation for other memory cells MC1 and MC2 after the read operation with respect to the selected cell MC1_S is terminated. Therefore, the read operation of the MRAM is not affected by RC delay caused due to the plurality of memory cells MC1 and MC2 connected with the bit lines BL0 to BL3 and BL0 to BL3, and a subsequent read operation or write operation can be executed. Therefore, using the second read operation enables increasing a speed of an operation of the MRAM.

An example where the memory cell MC2_S in the second region 12 is selected for reading will now be explained with reference to FIG. 7B. This example is the same as that depicted in FIG. 7A.

That is, a potential of a word line WL2_S and potentials of a pair of bit lines BL1 and bBL2 connected with a selected cell MC2_S are respectively controlled, and data is read from the selected cell MC2_S. At this time, in the plurality of first memory cells (non-selected cells) MC1 connected with the same main bit line BL1 as that of the selected cell MC2_S, a potential of a sub-bit line bBL1 connected with a memory cell MC1 is set to a potential (e.g., 0.4 V) that is substantially equal to that of the potential of the main bit line BL1. This arrangement can suppress generation of a cutoff current from the first memory cells MC1.

Furthermore, in the example depicted in FIG. 7B, at the time of the read operation with respect to the selected cell MC2_S, a potential (e.g., 0.4 V) is supplied to main bit lines BL0, BL2, and BL3 and sub-bit lines bBL0, bBL1, and bBL3 connected with non-selected cells MC1 and MC2. Therefore, the plurality of pairs of non-selected bits are charged. Therefore, the read operation can advance to a subsequent read operation or write operation without being affected by RC delay caused due to memory cells connected with the bit lines.

Accordingly, a speed of the operation of the MRAM can be increased.

As explained above, according to the second read operation depicted in FIGS. 7A and 7B, a potential is supplied to the bit lines connected with the non-selected cells during execution of the read operation for the selected cell. Therefore, the pairs of bit lines connected with the non-selected cells are charged. Thus, a read operation or a write operation after reading data can be executed with respect to the next memory cell to be selected without being affected by RC delay caused due to a magnetoresistive effect element or a select transistor connected with each bit line. Accordingly, the second read operation according to this embodiment can execute continuous data reading without producing a delay in the operation.

Furthermore, in this embodiment, like the first embodiment, the first and second memory cells MC1 and MC2 connected with the same main bit line in common are connected with the different first and second sub-bit lines bBL1 and bBL2, respectively. Therefore, controlling potentials of the sub-bit lines bBL1 and bBL2 enables avoiding occurrence of the cutoff current at the time of the read operation.

Therefore, according to the MRAM of the second embodiment of the present invention, adopting the second read operation enables suppressing degradation in a read margin and increasing a speed of the read operation of the MRAM.

[3] Third Embodiment

An MRAM according to a third embodiment of the present invention will now be described with reference to FIGS. 8 to 13B. In this embodiment, like reference numerals denote the same members as those in the first and second embodiments, thereby omitting a detailed explanation thereof.

(1) Basic Structure

Figure 8:
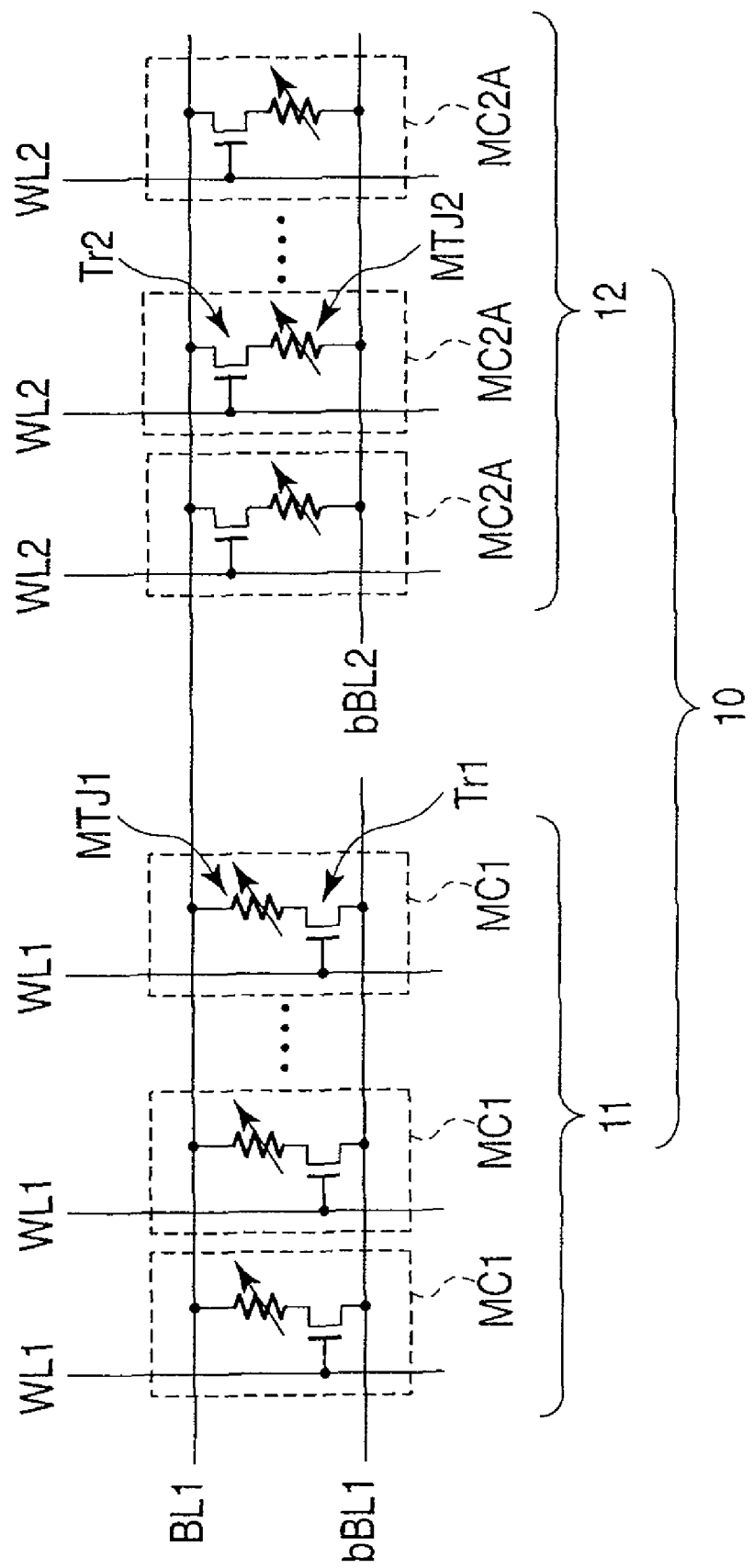
FIG. 8 is an equivalent circuit diagram for explaining a basic structure of the MRAM according to the third embodiment.

A basic structure of an MRAM according to a third embodiment of the present invention will now be described with reference to FIG. 8. The third embodiment of the present invention is different from the first embodiment in a connection relationship between first and second memory cells MC1 and MC2A provided in first and second regions 11 and 12 and pairs of bit lines. It is to be noted that a connection relationship between magnetoresistive effect elements MTJ1 and MTJ2 and select transistors Tr1 and Tr2 constituting the first and second memory cells MC1 and MC2A is the same as that of the first embodiment, thereby omitting a detailed explanation.

In each of the plurality of first memory cells MC1 in the first region 11, one end of a first magnetoresistive effect element MTJ1 is connected to a main bit line BL1. One end of a current path of a first select transistor Tr1 is connected with a sub-bit line bBL1 forming a bit line pair with the main bit line BL1.

In each of the plurality of second memory cells MC2A provided in the plurality of second regions 12, one end of a current path of a second select transistor Tr2 is connected with the main bit line BL1, and one end of a second magnetoresistive effect element MTJ2 is connected with a second sub-bit line bBL2.

As explained above, in this embodiment, like the first embodiment, the plurality of first memory cells MC1 provided in the first region 11 and the plurality of second memory cells MC2A provided in the second region 12 are connected with the same main bit line BL1 in common. Moreover, each first memory cell MC1 in the first region 11 and each second memory cell MC2A in the second region 12 are connected with the different sub-bit lines bBL1 and bBL2, respectively.

Additionally, this embodiment is different from the first embodiment in that one end of the current path of the select transistor Tr2 is connected with the main bit line BL1 and one end of the magnetoresistive effect element MTJ2 is connected with the sub-bit line bBL2 in the connection relationship of the second memory cell MC2A with respect to the main bit line BL1 and the second sub-bit line bBL2.

That is, in this embodiment, the connection relationship of the elements MTJ2 and Tr2 constituting the second memory cell MC2A with respect to the pair of bit lines BL1 and bBL2 is opposite to the connection relationship of the elements MTJ1 and Tr1 constituting the first memory cell MC1 with respect to the pair of bit lines BL1 and bBL1.

Even if the connection relationships of the constituent elements of the memory cells MC1 and MC2 with respect to the pair of bit lines are opposite in the first region 11 and the second region 12 as explained above, potentials of the sub-bit lines bBL1 and bBL2 can be individually controlled when the different sub-bit lines bBL1 and bBL2 are respectively connected with the memory cells MC1 and MC2A in the respective regions 11 and 12.

That is, setting potentials of the sub-bit lines bBL1 and bBL2 connected with memory cells in a region including no selected cell to a potential substantially equal to that of the main bit line BL1 enables preventing a cutoff current caused due to a select transistor included in each memory cell from being generated in the region including no selected cell.

Therefore, the MRAM according to the third embodiment of the present invention can suppress degradation in a read margin caused due to a cutoff current of the memory cells, like the first embodiment.

(2) Entire Structure

A structure of a memory cell array region of the MRAM according to the third embodiment of the present invention will now be described with reference to FIGS. 9 to 12.

(2-1) Circuit Configuration

A circuit configuration of the MRAM according to the third embodiment of the present invention will now be explained with reference to FIG. 9.

FIG. 9 shows an equivalent circuit in a memory cell array region of the MRAM according to this embodiment.

In this embodiment, the plurality of memory cells MC1 in the first region 11 are connected with the main bit line BL1 and the sub-bit line bBL1 forming the pair of bit lines BL1 and bBL1 in the same circuit configuration as that of the example (see FIG. 2) in the first embodiment.

That is, one end of the first magnetoresistive effect element MTJ1 constituting the first memory cell MC1 is connected with the first main bit line BL1, and one end of the current path of the first select transistor Tr1 constituting the first memory cell MC1 is connected with the sub-bit line bBL1.

The plurality of second memory cells MC2A provided in the second region 12 are also connected with the main bit line pair BL1 connected with the first memory cells MC1 in the first region 11. The second sub-bit line bBL2 forms the bit line pair with this main bit line BL1 with respect to each second memory cell MC2 connected with the main bit line BL1.

As explained above, in this embodiment, the plurality of first and second memory cells MC1 and MC2A connected with the same main bit BL1 are connected with the different sub-bit lines bBL1 and bBL2 in accordance with each first memory cell MC1 in the first region 11 and each second memory cell MC2A in the second region 12.

In each second memory cell MC2A connected with the first main bit line BL1, one end of the current path of the second select transistor Tr2 is connected with the first main bit line BL1. Additionally, in the second memory cell MC2A connected with the first main bit line BL1, one end of the second magnetoresistive effect element MTJ2 is connected with the second sub-bit line bBL2 forming the pair of bit lines with the first main bit line BL1.

Further, a bit line forming a pair of bit lines with the second sub-bit line bBL2 with respect to the plurality of memory cells MC1 in the first region 11 is the second main bit line BL2.

Each first memory cell MC1 connected with this pair of bit lines BL2 and bBL2 is connected with one pair of bit lines BL2 and bBL2 based on the same connection relationship as the memory cell MC1 connected with the pair bit lines BL1 and bBL1. That is, one end of the magnetoresistive effect element MTJ1 is connected with the second main bit line BL2, and one end of the current path of the select transistor Tr1 is connected with the second sub-bit line bBL2.

In this manner, based on the same circuit configuration as the connection relationship between the pair of bit lines BL1 and bBL1 and the memory cell MC1, in each of the plurality of memory cells MC1 in the first region 11, one end of the first magnetoresistive effect element MTJ1 is connected with the main bit line BL0 or BL3, and one end of the current path of the first select transistor Tr1 is connected with the sub-bit line bBL0 or bBL3.

Furthermore, the second bit line BL2 forms a pair of bit lines with the third sub-bit line bBL3 with respect to the plurality of memory cells MC2A in the second region 12.

The connection relationship of the second memory cells MC2A connected with the pair of bit lines BL2 and bBL3 are connected with the bit lines BL2 and bBL3 is similar to that of the memory cells MC2A with respect to the pair of bit lines BL1 and bBL2. That is, one end of the current path of the select transistor Tr2 constituting each memory cell MC2A is connected with the second main bit line BL2, and one end of the magnetoresistive effect element MTJ1 constituting each memory cell MC2A is connected with the third sub-bit line bBL3.

In this manner, based on the same circuit configuration as the connection relationship between the pair of bit lines BL1 and bBL2 and the memory cells MC2A, one end of the current path of the select transistor Tr2 is connected with the main bit lines BL0 and BL3 and one end of the magnetoresistive effect element MTJ2 is connected with the sub-bit lines bBL0 and bBL1 in each of the plurality of second memory cells MC2A in the second region 12.

As explained above, in the memory cell array 10 of the MRAM according to the third embodiment of the present invention, the plurality of memory cells MC1 and MC2 in the first and second regions 11 and 12 connected with the same main bit line BL1 are connected with the different sub-bit lines bBL1 and bBL2 in accordance with the first memory cell MC1 and the second memory cell MC2A.

Furthermore, according to this embodiment, in the plurality of memory cells MC1 and MC2A in the first and second regions 11 and 12 connected with the same main bit line BL1, the connection relationship between the elements constituting each second memory cell MC2A and the pair of bit lines is opposite to the connection relationship between the elements constituting each first memory cell and the pair of bit lines.

In the MRAM according to this embodiment having the circuit configuration depicted in FIG. 9, like the MRAM according to the first embodiment, even if the first memory cells MC1 in the first region 11 and the second memory cells MC2A in the second region are connected with the same main bit line BL1 in common, they are connected with the different sub-bit lines bBL1 and bBL2, thereby individually controlling potentials of the sub-bit lines bBL1 and bBL2 in accordance with each of the first and second memory cells MC1 and MC2A.

Therefore, set potentials of the main bit line and the sub-bit line can be equalized with respect to memory cells in a region including no selected cell, thus preventing a cutoff current from being generated.

As explained above, according to the MRAM of the third embodiment of the present invention, degradation in a read margin can be suppressed like the MRAM according to the first embodiment.

(2-2) Structure

Figure 10:
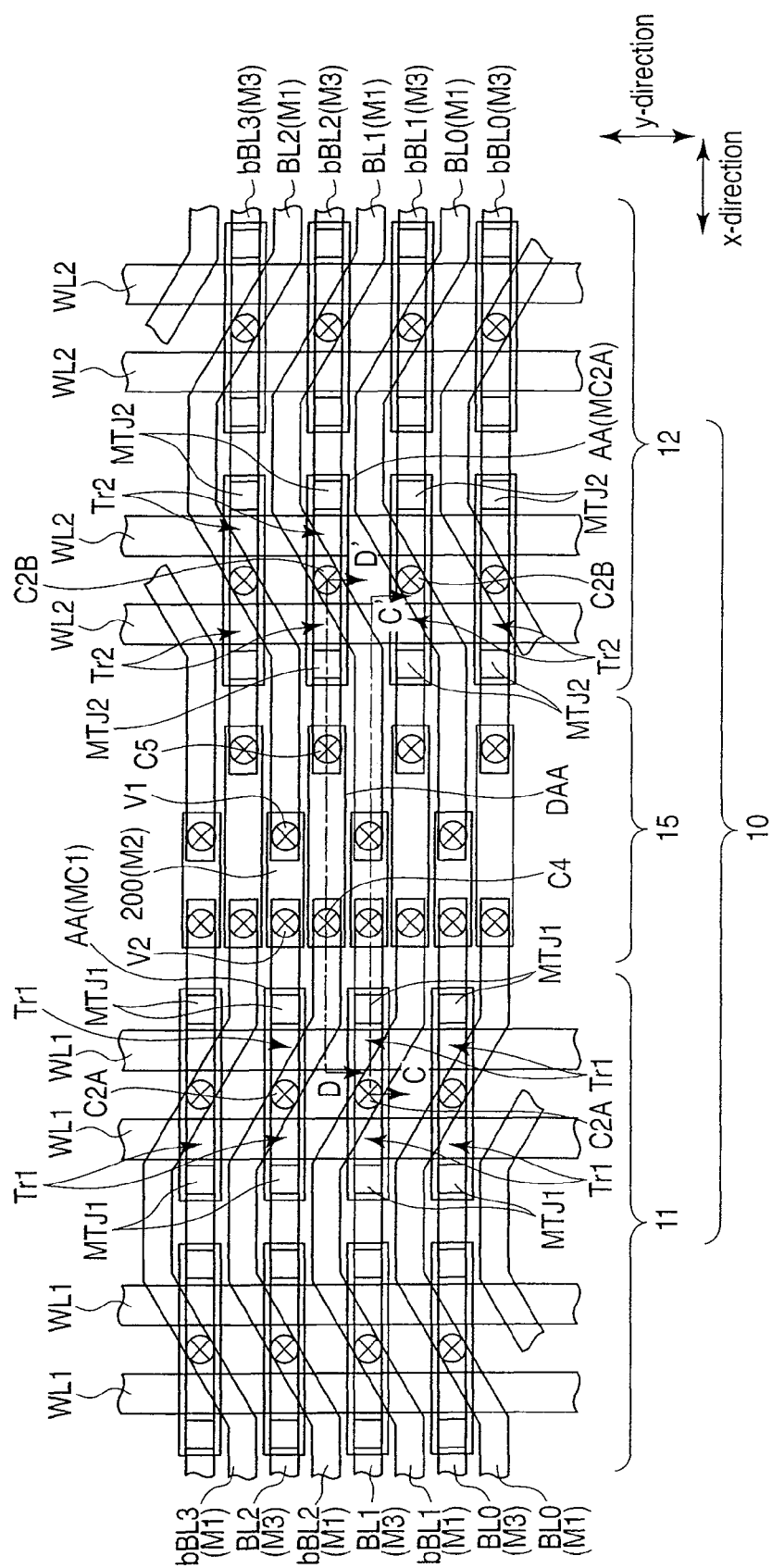
FIG. 10 is a plan view showing a layout of the memory cell array of the MRAM according to the third embodiment.
Figure 11:
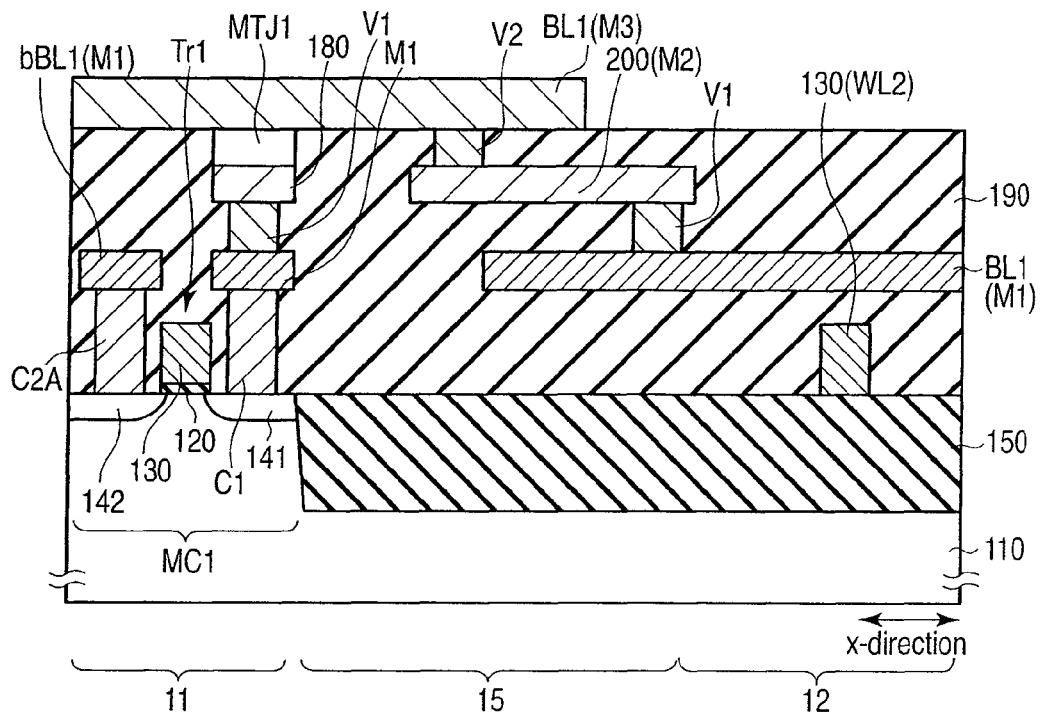
FIG. 11 is a cross-sectional view taken along a line C-C' in FIG. 10.

A structure of the MRAM according to the third embodiment of the present invention will now be explained with reference to FIGS. 10 and 12. FIG. 10 shows a layout of the memory cell array 10 of the MRAM according to this embodiment. FIG. 11 shows a cross-sectional structure taken along a line C-C' in FIG. 10, and FIG. 12 shows a cross-sectional structure taken along a line D-D' in FIG. 10.

Figure 12:
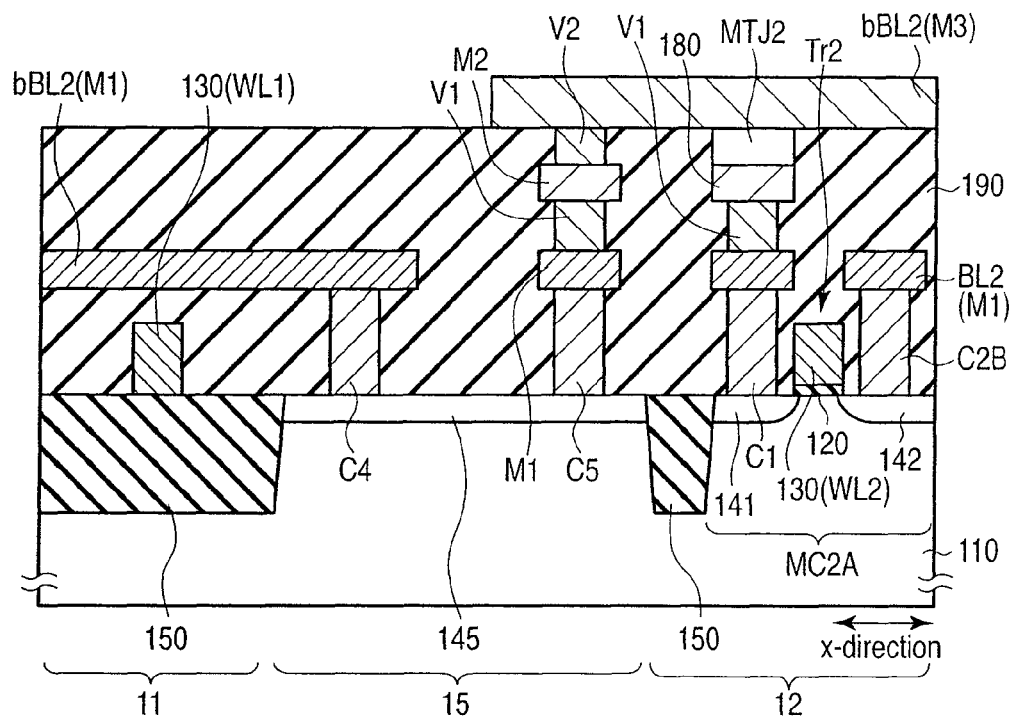
FIG. 12 is a cross-sectional view taken along a line D-D' in FIG. 10.

As shown in FIGS. 10 and 12, the first region 11 and the second region 12 are provided in the memory cell array 10 of the MRAM according to this embodiment. The first memory cell MC1 is provided in each active region AA in the first region 11. Moreover, the second memory cell MC2A is provided in each active region AA in the second region 12. It is to be noted that two memory cells are formed in one active region AA like the first embodiment.

In this embodiment, for example, a bit line switching region (a line switching region) 15 is provided between the first region 11 and the second region 12. Switching interconnect lines 200 or via plugs V2 formed in this bit line interconnect region 15 switch a connection relationship between interconnections M1 and M3 provided in the first region 11 and a connection relationship between interconnections M1 and M3 provided in the second region 12.

As shown in FIGS. 10 to 12, for example, the first main bit line BL1 is formed of the third interconnection M3 provided on an interlayer insulating film 190 in the first region 11 provided in the first memory cell MC1. On the other hand, in the second region 12 where the second memory cells MC2 are provided, the main bit line BL1 is formed of the first interconnection M1. Furthermore, for example, the sub-bit line bBL1 is formed of the first interconnection M1 in the first region 11. On the other hand, in the second region 12, the sub-bit line bBL1 is formed of the third interconnection M3.

As explained above, in the memory cell array 10 of the MRAM according to this embodiment, since the connection relationship between the bit lines and the memory cells in the first region 11 is opposite to that in the second region 12, the same main bit lines BL0 to BL3 or the same sub-bit lines bBL0 to bBL3 are formed of the different interconnections M1 and M3 in accordance with each of the first region 11 and the second region 12.

Therefore, as shown in FIG. 11, the bit line switching region 15 is provided in the memory cell array 10 between the first region 11 and the second region 12, and the third interconnection M3 (the main bit line BL1) led into the bit line switching region 15 from the first region 11 is connected with the first interconnection M1 led into the bit line switching region 15 from the second region 12 via the second interconnection M2 (a switching interconnect line 200) and two via plugs V1 and V2, for example. As a result, the main bit line BL1 utilized for the first memory cell MC1 and the second memory cell MC2A in common is formed.

Moreover, as shown in FIG. 12, the first interconnection M1 (the sub-bit line bBL1) led into the bit line switching region 15 from the first region 11 is connected with a diffusion layer 145 provided in a dummy active region DAA (a semiconductor substrate 110) via a contact plug C4, for example. The third interconnection M3 led into the bit line switching region 15 from the second region 12 is connected with the diffusion layer 145 via the via plugs V1 and V2, a contact plug C5, and the two interconnections M1 and M2. This diffusion layer 145 serves as a current path (a switching interconnect line), and the interconnection M1 in the first region 11 is connected with the interconnection M3 in the second region 12, thereby forming the first sub-bit line bBL1 used for the first memory cell MC1 and the second memory cell MC2A in common.

When one bit line is formed of the first interconnection M1 and the third interconnection M3 as in this embodiment, the first main bit line BL1 has, e.g., a planar structure having a linear shape in the first region 11 and a zigzag shape in the second region 12. Alternatively, for example, the first sub-bit line bBL1 has, e.g., a planar structure having a zigzag shape in the first region 11 and a linear shape in the second region 12.

It is to be noted that the second interconnection M2 functions as the switching interconnect line 200 that is used to connect the first and third interconnections and also functions as, e.g., a lower electrode 180 of the magnetoresistive effect elements MTJ1 and MTJ2.

Additionally, in this embodiment, a layout of each active region AA provided in the memory cell array 10 (the semiconductor substrate 110) differs in accordance with each of the first region 11 and the second region 12. Specifically, in the plurality of active regions AA aligned in the x-direction, the active regions AA in the second region 12 are not aligned on the same straight line as that of the active regions AA in the first region 11. The active regions AA in the second region 12 have a layout that deviates in the y-direction with respect to the active regions AA in the first region 11. It is to be noted that the active regions AA are aligned in an array form in the x-direction and the y-direction in each of the regions 11 and 12.

As a result, each of the interconnections M1 to M3 functioning as switching interconnect lines and the diffusion layers (the dummy active regions DAA) can have a linear shape in the bit line switching region 15. In this manner, when the layout of each active region AA in the first region 11 is different from that in the second region 12, the first interconnection M1 can be connected with the third interconnection without using a switching interconnect line (the second interconnection M2) having a complicated shape.

As shown in FIGS. 10 and 12, the bit line switching region 15 is provided between the first region 11 and the second region 12 in the memory cell array 10 of the MRAM according to this embodiment. The switching interconnect lines 145 and 200 formed in this bit line switching region 15 switch the connection relationship between the interconnection M1 or M3 that becomes the main or sub-bit line in the first region 11 and the interconnection M3 or M1 that becomes the main or sub-bit line in the second region 12.

As a result, in the connection relationship of the memory cells MC1 provided in the first region 11 and the memory cells MC2A provided in the second region 12 with respect to the pairs of bit lines according to this embodiment, the respective memory cells MC1 and MC2 are connected with the same main bit line BL1, the first memory cells MC1 are connected with the first sub-bit line bBL1, and the second memory cells MC2 are connected with the second sub-bit line bBL2. Further, in the memory cell array 10 of the MRAM according to this embodiment, the switching interconnect lines 145 and 200 formed in the bit line switching region 15 are utilized to connect one end of the current path of the select transistor constituting each second memory cell MC2A with the main bit line BL1 and connect one end of the magnetoresistive effect element constituting each second memory cell MC2A with the sub-bit line bBL2.

It is to be noted that the structure of the switching interconnect line that is used to connect the interconnections M1 to M3 provided in the first region 11 with the interconnections M1 to M3 provided in the second region 12 or the layout of each active region AA (MC1) in the first region 11 and each active region AA (MC2) in the second region 12 is not restricted to the structure depicted in FIGS. 10 to 12, and it can be appropriately changed.

(3) Operation

A read operation of the MRAM according to the third embodiment of the present invention will now be described with reference to FIGS. 13A and 13B. The MRAM according to this embodiment also operates based on the same principle as the MRAM according to the first embodiment, thereby omitting a detailed description thereof.

Further, in regard to the read operation described with reference to FIGS. 13A and 13B, an example using the first read operation will be explained, and a detailed explanation of the same operation as that in the first embodiment will be omitted.

Figure 13A:
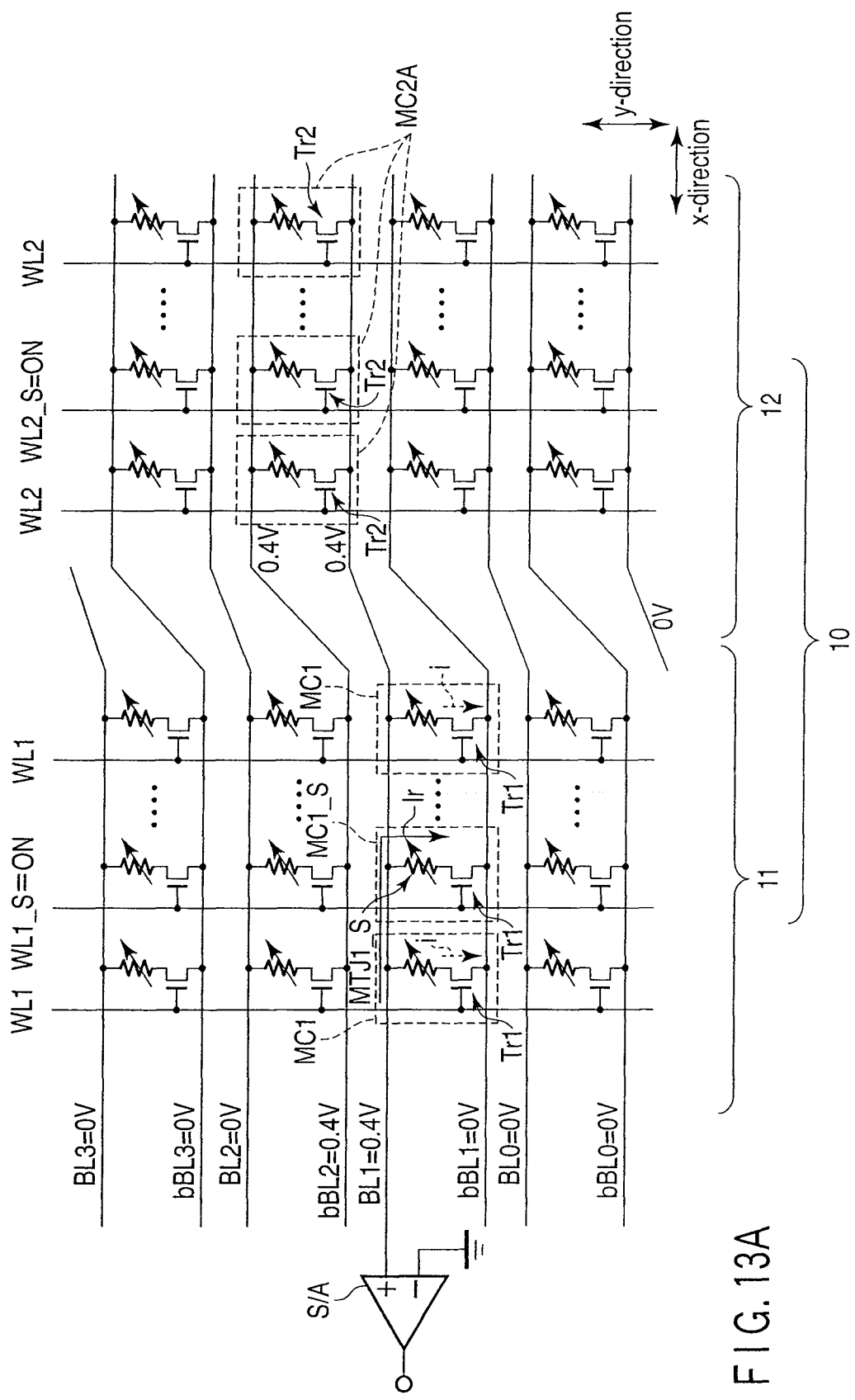
FIG. 13A is a view for explaining a read operation of the MRAM according to the third embodiment.

FIG. 13A is a schematic view for explaining the read operation with respect to the first memory cell MC1_S provided in the first region 11.

First, like the first embodiment, when a selected word line WL1_S is set to a high potential, a selected transistor Tr1_S constituting a selected cell MC1_S is turned on.

Then, of the pair of bit lines BL1 and bBL1 connected with the selected cell MC1_S, the first main bit line (the selected bit line) BL1 is set to a high potential (e.g., 0.4 V), and the first sub-bit line bBL1 is set to a low potential (e.g., 0 V). Furthermore, a read current Ir flows toward a current path of a select transistor Tr1 from a magnetoresistive effect element MTJ1_S in the selected cell MC1_S. As a result, a potential of the first main bit line BL1 fluctuates in accordance with a tunnel resistance value of the magnetoresistive effect element MTJ1_S. Furthermore, a sense amplifier S/A connected with the main bit line BL1 detects a fluctuation amount, thereby discriminating data stored in the selected cell MC1_S.

In the second memory cell MC2 in the second region 12 connected with the same main bit line BL1 as that of the selected cell MC1_S, the second memory cell MC2 is connected with the sub-bit line bBL2. When reading data with respect to the selected cell MC1_S, this sub-bit line bBL2 is set to the same potential (e.g., 0.4 V) as the main bit line BL1 connected with the selected cell MC1_S.

In this case, in each second memory cell (the non-selected cell) connected with the selected main bit line BL1, since a potential of the main bit line BL1 connected with the memory cell MC2 is substantially the same as a potential of the sub-bit line bBL2, a potential difference between the pair of lines BL1 and bBL2 is eliminated. Therefore, in the non-selected cells MC2 in the second region 12 connected with the same bit line BL1 as the selected cell MC1_S, a cutoff current due to the select transistors Tr2 constituting the respective non-selected cells MC2 is not generated.

Therefore, the cutoff current of the non-selected cells MC in the second region 12 does not fluctuate the potential of the main bit line BL1 connected with the selected cell MC1_S. That is, a total of the cutoff current that adversely affects sensing with respect to the selected bit line BL1 is reduced.

Figure 13B:
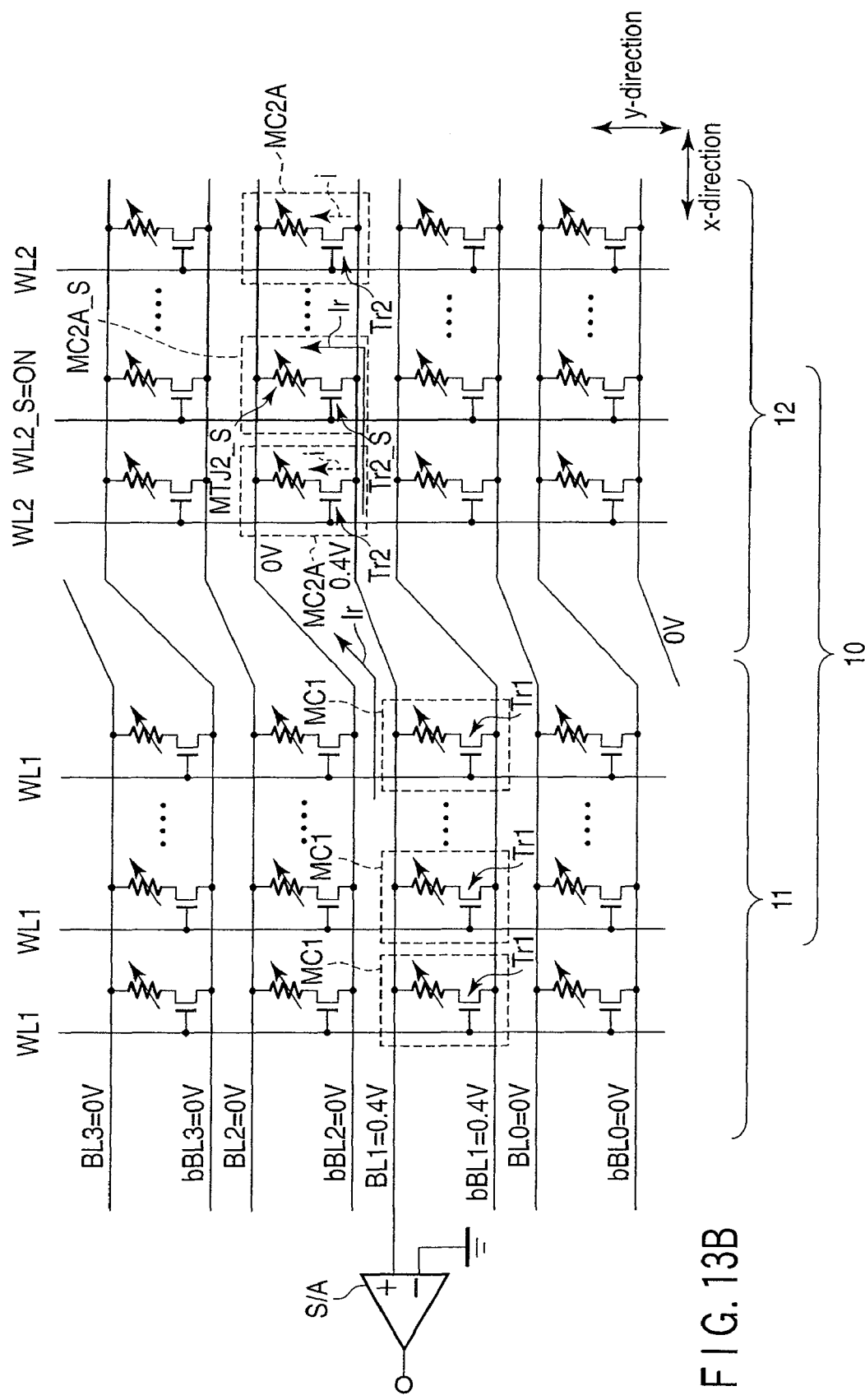
FIG. 13B is a view for explaining the read operation of the MRAM according to the third embodiment.

FIG. 13B is a schematic view for explaining a read operation for each second memory cell MC2_S provided in the second region 12.

Like the read operation for each memory cell MC1 in the first region 11, a selected word line WL2_S is set to a high potential, and a select transistor Tr2_S constituting the selected cell MC2A_S is turned on.

Thereafter, of the pair of bit lines BL1 and bBL2 connected with the selected cell MC2A_S, the first main bit line BL1 is set to a high potential (e.g., 0.4 V), and the second sub-bit line bBL2 is set to a low potential (e.g., 0 V). In this embodiment, in each memory cell MC2A in the second region 12, the connection relationship of the constituent elements MTJ2 and Tr2 of the memory cell MC2A with respect to the main bit line BL1 and the sub-bit line bBL2 is opposite to the connection relationship of the constituent elements MTJ1 and Tr1 of the memory cell MC1 in the first region 11 with respect to the main bit line BL1 and the sub-bit line bBL1.

Therefore, in regard to the selected cell MC2A_S in the second region 12, the read current Ir flows toward the magnetoresistive effect element MTJ2_S from the current path of the select transistor Tr2 in the selected cell MC2_S. As a result, the potential of the main bit line BL1 fluctuates in accordance with a tunnel resistance value of the magnetoresistive effect element MTJ2_S. The sense amplifier S/A connected with the main bit line BL1 detects a fluctuation amount, thereby discriminating data stored in the selected cell M2A_S.

The first memory cell MC1 connected with the same main bit line BL1 as that of the selected cell M2_S is connected with the sub-bit line bBL1. At the time of reading data with respect to the selected cell MC2_S, this sub-bit line bBL1 is set to, e.g., the same potential (e.g., 0.4 V) as that of the main bit line BL1 connected with the selected cell MC2_S.

In this case, in regard to each non-selected cell MC1 in the first region 11 connected with the selected main bit line BL1, since the potential of the main bit line BL1 connected with the non-selected cell MC1 is substantially equal to the potential of the sub-bit line bBL1, a potential difference between the pair of bit lines BL1 and bBL1 is eliminated.

Therefore, in each non-selected cell MC1 in the first region 11 connected with the same main bit line BL1 as that of the selected cell MC2A_S, a cutoff current caused due to the select transistor Tr1 constituting the non-selected cell MC1 is not generated. That is, a total of the cutoff current that adversely affects sensing with respect to the selected bit line is reduced.

Therefore, the cutoff current of each non-selected cell in the first region 11 does not fluctuate the potential of the main bit line BL1 connected with the selected cell MC2A_S.

As explained above, according to the MRAM of the third embodiment of the present invention, like the MRAM according to the first embodiment, degradation in a read margin due to the cutoff current can be suppressed in particular.

It is to be noted that the read operation of the MRAM according to this embodiment can be executed even if the second read operation described in the second embodiment is used. When the second read operation is applied to the MRAM according to this embodiment, setting the potential of the second main bit line BL2 to be substantially equal to the potential of the first main bit line BL1 enables suppressing degradation in a read margin and increasing a speed of the operation of the MRAM like the second embodiment.

[4] Fourth Embodiment

As described in the first to third embodiments, two memory cells are provided in one active region AA, and select transistors in these two memory cells share one source/drain diffusion layer to form a shared node. Further, ends of magnetoresistive effect elements on one side and the shared node of the select transistors included in the two memory cells are connected with one pair of bit lines. This circuit configuration of the two memory cells is called a cell group.

A fourth embodiment according to the present invention relates to a layout of the cell group on a semiconductor substrate. An MRAM according to a fourth embodiment of the present invention will now be described hereinafter with reference to FIGS. 14 to 18.

(1) Structure

A structure of an MRAM according to the fourth embodiment of the present invention will now be described with reference to FIGS. 14 to 17.

Figure 14:
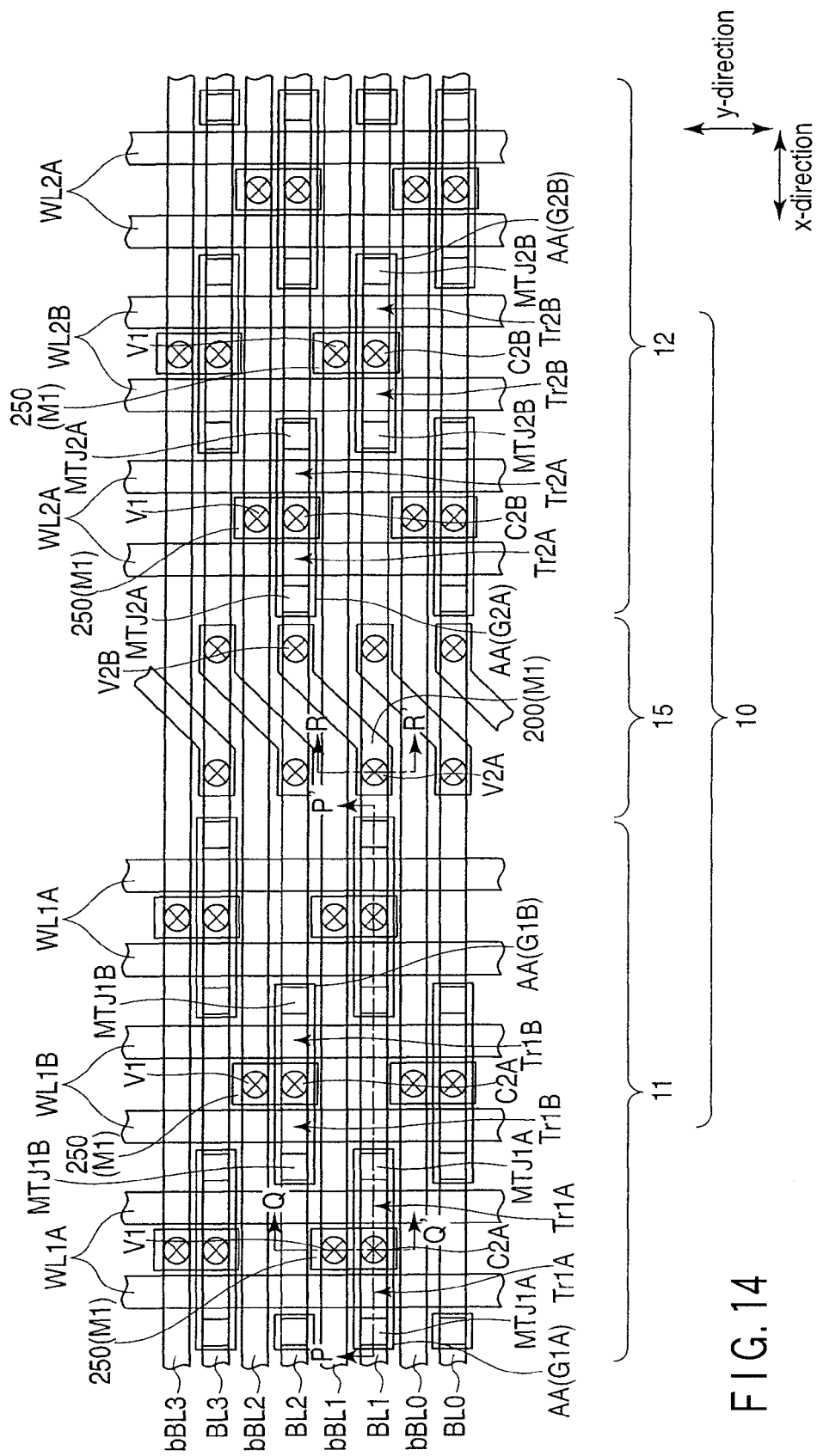
FIG. 14 is a layout of a memory cell array of an MRAM according to a fourth embodiment.
Figure 15:
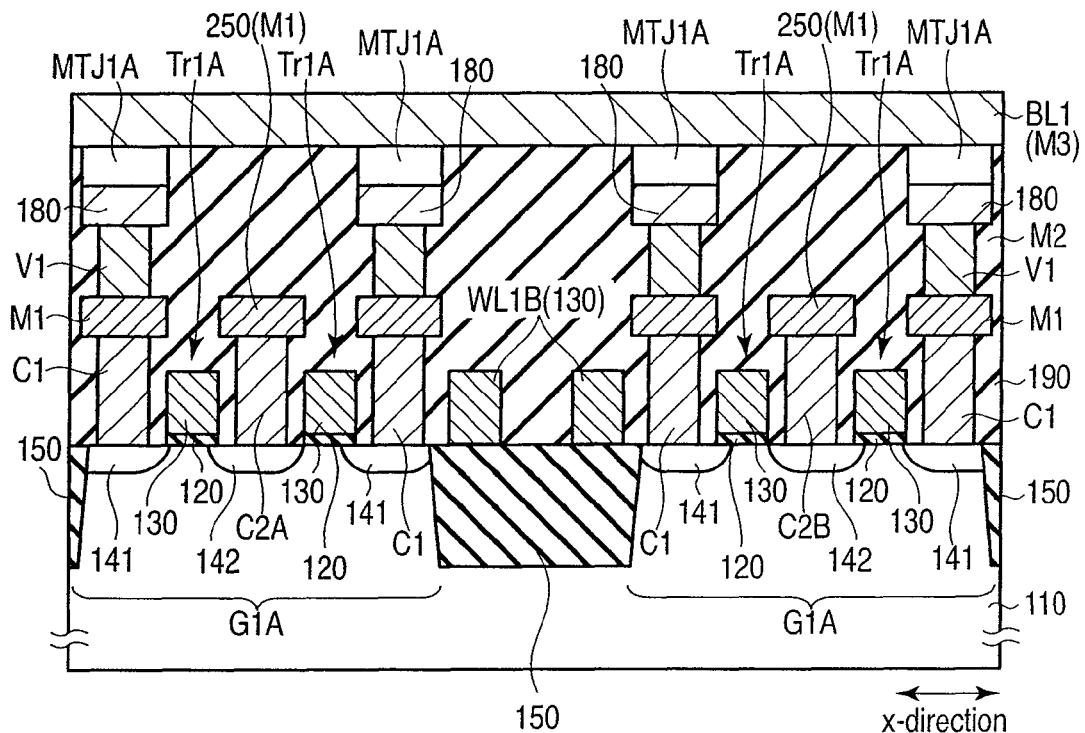
FIG. 15 is a cross-sectional view taken along a line P-P' in FIG. 14.
Figure 16:
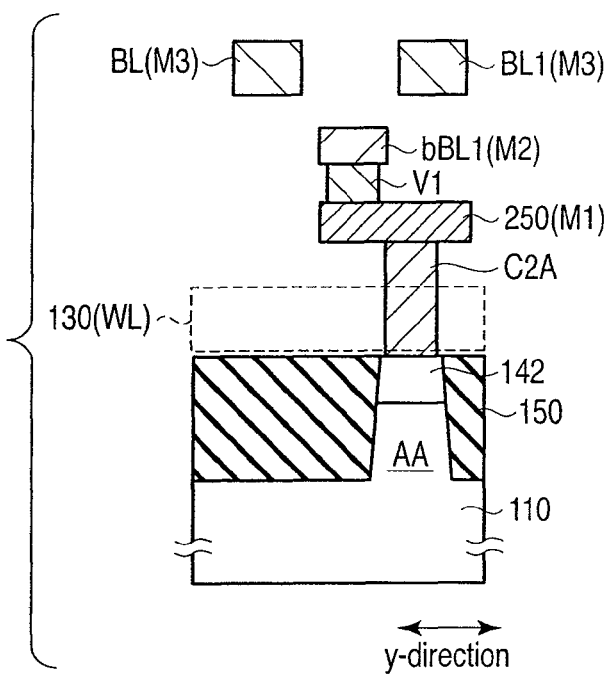
FIG. 16 is a cross-sectional view taken along a line Q-Q' in FIG. 14.
Figure 17:
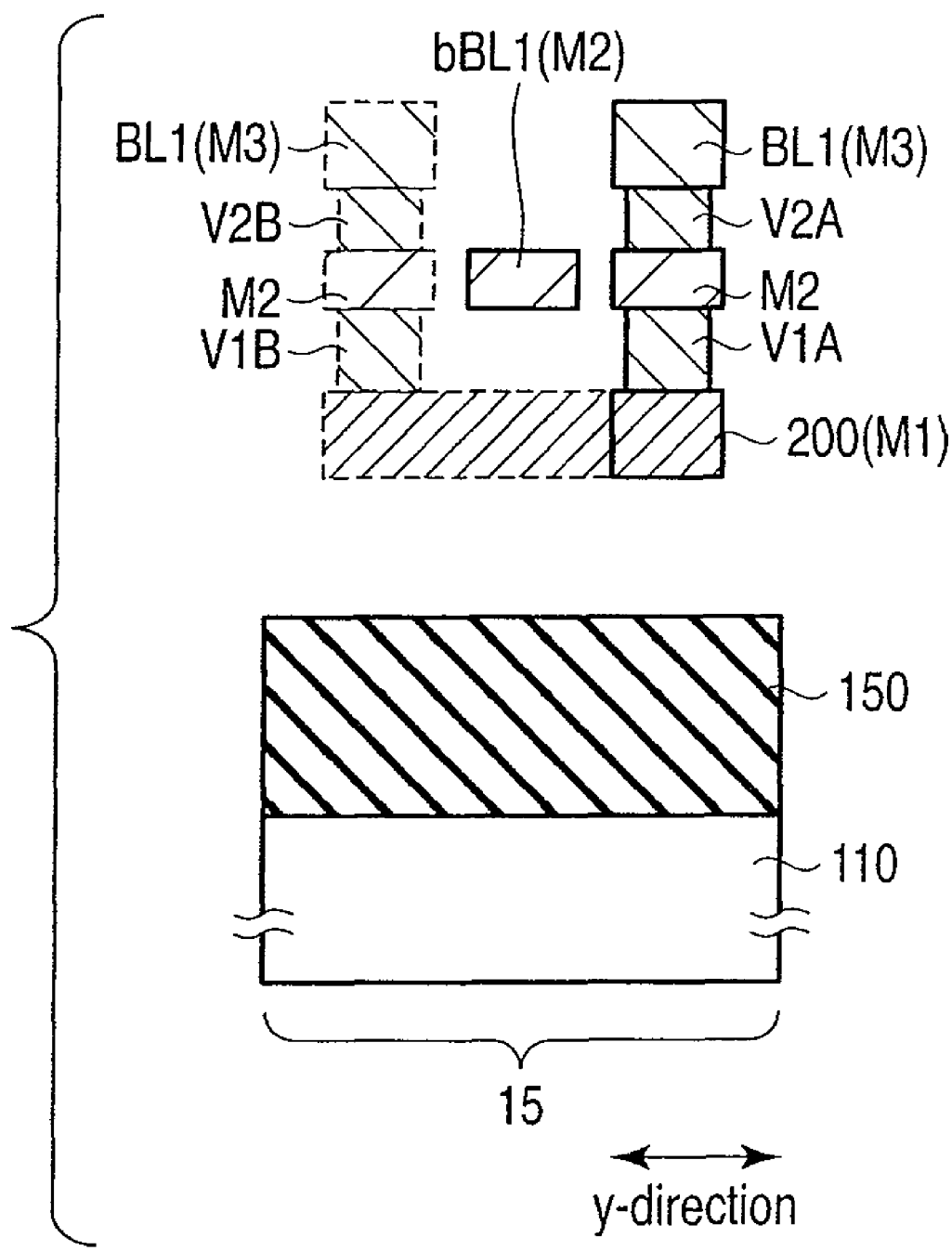
FIG. 17 is a cross-sectional view taken along a line R-R' in FIG. 14.

FIG. 14 shows a layout of a memory cell array 10 of the MRAM according to this embodiment. FIG. 15 shows a cross-sectional structure taken along a line P-P' in FIG. 14, and FIG. 16 shows a cross-sectional structure taken along a line Q-Q' in FIG. 14. Furthermore, FIG. 17 shows a cross-sectional structure taken along a line R-R' in FIG. 14. It is to be noted that an interlayer insulating film is omitted in FIGS. 16 and 17 for clarification of members. Moreover, members provided in a front-side direction and a depth direction are indicated by broken lines.

As shown in FIGS. 14 to 17, a plurality of active regions AA are provided in first and second regions 11 and 12 of a memory cell array 10. Two memory cells, i.e., one cell group G1A or G1B is provided in one active region AA in the first region 11 like the first and second embodiments. One cell group G2A or G2B is provided in one active region AA in the second region 12 like the first region 11. In this embodiment, a cell size of one memory cell is $8F^2$.

It is to be noted that structures of magnetoresistive effect elements MTJ1A and MTJ1B and select transistors Tr1A and Tr1B respectively constituting the cell groups G1A and G1B in the first region 11 are the same as the magnetoresistive effect elements and the select transistors described in the first to third embodiments. Moreover, structures of magnetoresistive effect elements MTJ2A and MTJ2B and select transistors Tr2A and Tr2B included in the cell groups G2A and G2B in the second region 12 are likewise the same as the magnetoresistive effect elements and the select transistors described in the first to third embodiments. Therefore, in this embodiment, a detailed explanation of the structures of the magnetoresistive effect elements MTJ1A to MTJ2B and the select transistors Tr1A to Tr2B will be omitted.

In the first region 11, each of main bit lines BL0 to BL3 and sub-bit lines bBL0 to bBL3 has a linear shape and is extended in the x-direction. Each of the main bit lines BL0 to BL3 is formed of, e.g., a third interconnection M3, and each of the sub-bit lines bBL0 to bBL3 is formed of, e.g., a second interconnection M2. In the first and second regions 11 and 12, as a layout, the bit lines are arranged in such a manner that the main bit lines BL0 to BL3 and the sub-bit lines bBL0 to bBL3 are alternately aligned in the y-direction.

One end of each of the magnetoresistive effect elements MTJ1A and MTJ1B included in the respective cell groups G1A, G1B, G2A, and G2B is connected with each of the main bit lines BL0 to BL3.

Each shared node of the cell groups G1A, G1B, G2A, and G2B is connected with each of the sub-bit lines bBL0 to bBL3 through a first interconnection M1 (which will be referred to as a lead-out interconnect line 250 hereinafter) and a via plug V1. The shared node is formed of, e.g., one source/drain diffusion layer 142 shared by two select transistors included in each of the cell groups G1A, G1B, G2A, and G2B as explained above (see, e.g., FIGS. 4A and 4B).

The lead-out interconnect line 250 is connected with a contact plug C2A or C2B on the source/drain diffusion layer 142. The lead-out interconnect line M1 is arranged between two word lines on one active region AA and extended in a direction of extension of the word lines (the y-direction) to get across one main bit line and one sub-bit line.

In the plurality of cell groups G1A and G1B in the first region 11, the lead-out interconnect line 250 is drawn in the same direction (e.g., an upper side in a page space of FIG. 14) from a contact plug 2A (the shared node). Further, in the plurality of cell groups G2A and G2B in the second region 12, the lead-out interconnect line 250 is drawn in the same direction (e.g., the upper side in the page space of FIG. 14) from a contact plug C2B (the shared node).

The cell groups G1A and G1B in the first region 11 adjacent to each other in the x-direction are connected with each of the same main bit lines BL0 to BL4. Additionally, the cell groups G1A and G1B adjacent to each other in the x-direction are connected with each of the same sub-bit lines bBL0 to bBL4 through the lead-out interconnect line 250.

In the first region 11, word lines WL1A and WL1B are extended in the y-direction. The cell groups G1A adjacent to each other in the y-direction are connected with the word line WL1A in common. The word line WL1A is formed of, e.g., a gate electrode of the select transistor Tr1A included in the cell group WL1A. The word line WL1B is connected with the cell groups G1B adjacent to each other in the y-direction. The word line WL1B is formed of, e.g., a gate electrode of the select transistor Tr1B included in the cell group G1B.

The cell groups G1A and G1B adjacent to each other in the y-direction are connected with different pairs of bit lines. However, the respective cell groups G1A and G1B have the same connection relationship between constituent elements and a pair of bit lines. In the first region 11, the cell groups G1A and G1B adjacent to each other in an oblique direction are connected with different bit lines but have the same connection relationship between the constituent elements of each cell group and the pair of bit lines.

The cell groups G1A and G1B adjacent to each other in the oblique direction do not share the word line. Therefore, the word line WL1B utilized by the cell group G1B just runs between the two cell groups G1A adjacent to each other in the x-direction, and it is not connected with the cell groups G1A.

Furthermore, each pair of bit lines (e.g., a pair of bit lines BL2 and bBL2) utilized by the cell group G1B just run between the two cell groups G1A adjacent to each other in the y-direction, and they are not connected with the cell groups G1A.

As explained above, in the memory cell array 10 of the MRAM according to this embodiment, as to the cell groups G1A and G1B provided in the first region 11, the cell groups adjacent to each other in the x-direction, the cell groups adjacent to each other in the y-direction, and the cell groups adjacent to each other in the oblique direction achieve a translational relationship. It is to be noted that the translational relationship means a relationship of translational symmetry.

As to the cell groups G2A and G2B provided in the second region 12, all the cell groups adjacent to each other in the x-direction, the cell groups adjacent to each other in the y-direction, and the cell groups adjacent to each other in the oblique direction achieve a translational relationship like the cell groups G1A and G1B in the first region. That is, the cell groups adjacent to each other have the same connection relationship with respect to the pair of bit lines connected with each of the cell groups G2A and G2B.

A bit line switching region 15 is provided between the first and second regions 11 and 12. A plurality of switching interconnect lines 200 are formed in the bit line switching region 15.

In this embodiment, these switching interconnect lines 200 achieve connection between the third interconnection M3 in the first region 11 and the third interconnection M3 in the second region 12.

As shown in FIG. 14, for example, the second interconnection M2 serving as each of the sub-bit lines bBL0 to bBL3 has a linear shape and is extended toward the second region 12 from the first region 11 to get across the bit line switching region 15.

On the other hand, for example, the third interconnection M3 serving as each of the main bit lines BL1 to BL3 has a linear shape like the sub-bit liens bBL0 to bBL3, but it is divided in the bit line switching region 15 to be individually provided in the first region 11 and the second region 12.

Further, each switching interconnect line 200 enables connecting the third interconnection M3 in the first region 11 with the third interconnection M3 in the second region 12.

For example, the interconnection M3 serving as the first main bit line BL1 in the first region 11 is connected with the interconnection M3 in the second region 12 placed on the same straight line in the x-direction as the second main bit line BL2 in the first region 11 through the switching interconnect line 200. The switching interconnect line 200 is extended in the oblique direction through a lower side of the first sub-bit line bBL1 (the second interconnection M2).

As explained above, in this embodiment, each switching interconnect line 200 achieves connection of the interconnection M3 in the first region 11 with the interconnection M3 in the second region 12, thereby forming one main bit line.

As explained above, in the MRAM according to this embodiment having the memory cell array 10 in which the cell groups adjacent to each other in the x-direction, the y-direction, and the oblique direction achieve the translational relationship, each first cell group G1A or G1B (the memory cell) in the first region 11 and each second cell group G2A or G2B in the second region 12 are connected with the same main bit line in common, and each first cell group G1A or G1B and each second cell group are connected with the different sub-bit lines bBL1 and bBL2.

Therefore, in the MRAM according to the fourth embodiment of the present invention, like the first to third embodiments, degradation in a read margin due to a cutoff current can be suppressed.

It is to be noted that the description has been given as to an example where the switching interconnect lines 200 are provided in the bit line switching region 15 and each of the switching interconnect lines 200 is utilized to connect each interconnection M3 provided in each of the first and second regions 11 and 12 to constitute the main bit line in this embodiment. However, the present invention is not restricted thereto, and the same effect as that of this embodiment can be obtained even in a case where each switching interconnect lines 200 achieve connection of the second interconnection M2 provided in the first and second regions 11 and 12 to form the sub-bit lines bBL0 to bBL3.

(2) Circuit Configuration and Operation

A circuit configuration and an operation of the memory cell array 10 of the MRAM according to the fourth embodiment of the present invention will now be described with reference to FIG. 18. FIG. 18 is a schematic view for explaining an equivalent circuit of the memory cell array 10 of the MRAM according to this embodiment and an operation thereof.

As shown in FIG. 18, the main bit lines BL0 to BL3 and the sub-bit lines bBL0 to bBL3 are extended in the x-direction. Further, the plurality of word lines WL1A, WL1B, WL2B, and WL2B are extended in the y-direction. The word lines WL1A and WL1B are provided in the first region 11, and the word lines WL2A and WL2B are provided in the second region 12.

The plurality of cell groups G1A, G1B, G2A, and G2B are provided in the first and second regions 11 and 12, respectively.

The word line WL1A is used for the cell groups G1A in the first region 11, and the word line WL1A is shared by and connected with the plurality of cell groups G1A adjacent to each other in the y-direction. The word line WL1B is used for the cell groups G1B in the first region 11, and the word line WL1B is shared by and connected with the plurality of cell groups G1B adjacent to each other in the y-direction. It is to be noted that the word line WL1B runs between the two cell groups G1A adjacent to each other in the x-direction and it is not connected with the cell groups G1A.

Like the cell groups G1A and G1B in the first region 11, the word line WL2A is used for the cell groups G2A in the second region 12, and the word line WL2B is used for the cell groups G2B in the second region 12.

The word lines WL2A and WL2B are shared by and connected with the plurality of cell groups G2A and G2B adjacent to each other in the y-direction. It is to be noted that the word line WL2B runs between the two cell groups G2A adjacent to each other in the x-direction and it is not shared by and connected with the cell groups G2A.

In the memory cell array 10 in the example depicted in FIG. 18, the connection relationship of the magnetoresistive effect element and the select transistor with respect to each pair of bit lines is substantially the same as that of the first embodiment (see FIG. 2).

For example, in each cell group G1A or G2A in the first or second region 11 or 12 connected with the same first main bit line BL1, one end of the magnetoresistive effect element MTJ1A or MTJ2A is connected with the main bit line BL1.

Further, in the cell group G1A in the first region 11, one end of a current path (a shared node) of the select transistors Tr1A in the cell group G1A is connected with the first sub-bit line bBL1. On the other hand, in the cell group G2A in the second region 12, one end of a current path (a shared node) of the select transistors Tr2A in the cell group G2A is connected with the second sub-bit line bBL2.

In the MRAM in which the cell groups adjacent to each other in the x=direction, the cell groups adjacent to each other in the y=direction, and the cell groups adjacent to each other in the oblique direction all achieve a translational relationship, the plurality of cell groups (the memory cells) G1A, G1B, G2A, and G2B connected with the same main bit line BL1 in common are connected with the different sub-bit lines bBL1 and bBL2 in accordance with each of the cell groups G1A and G1B in the first region 11 and the cell groups G2A and G2B in the second region 12.

The memory cell array 10 in the MRAM according to this embodiment depicted in FIG. 18 can use the first or second read operation to execute the read operation. A description will now be given as to an example where the first read operation is used to read data with respect to a selected cell MC1_S in the first region 11.

As shown in FIG. 18, a word line WL1A_S utilized for the selected cell MC1_S in the cell group G1A is set to a high potential, and a select transistor Tr1_S in the selected cell MC1_S is turned on.

Furthermore, potentials of the pair of bit lines BL1 and bBL1 used for the selected cell MC1_S are controlled. The first man bit line BL1 is set to a high potential (e.g., 0.4 V), and the first sub-bit line bBL1 is set to a low potential (e.g., 0 V).

At this time, in the plurality of cell groups G2B in the second region 12 connected with the same main bit line BL1 as that of the selected cell MC1_S, a potential of the second sub-bit line bBL2 used for these cell groups G2B is set to a potential (e.g., 0.4 V) substantially equal to that of the main bit line BL1. Therefore, a potential difference between the pair of bit lines BL1 and bBL2 connected with the cell groups G2B in the second region 12 is reduced. As a result, in the plurality of cell groups G1A and G2A in the first and second regions 11 and 12 connected with the same main bit line BL1, a cutoff current can be prevented from being generated from the cell groups G2A (the memory cells) in the second region 12.

Therefore, when reading data from the selected cell in the first region 11, a potential of the main bit line BL1 connected with the selected cell can be prevented from being fluctuated due to the cutoff current.

Moreover, the read operation for the selected cell in the second region 12 connected with the pair of bit lines BL1 and bBL2 is carried out as follows.

The word line used for the selected cell is set to a high potential, and the select transistor in the selected cell is turned on.

Additionally, the first main bit line BL1 connected with the selected cell in the second region 12 is set to a high potential (e.g., 0.4 V), and the second sub-bit line bBL2 is set to a low potential (e.g., 0 V). On the other hand, in the plurality of cell groups G1A in the first region 11 connected with the same main bit line BL1 as the selected cell in common, a potential of the sub-bit line bBL1 connected with these cell groups G1A is set to a potential (e.g., 0.4 V) substantially equal to that of the main bit line BL1.

As a result, a potential difference between the pair of bit lines BL1 and bBL1 connected with the cell groups (non-selected cells) G1A in the first region 11 is reduced, thereby preventing a cutoff current from being generated from the cell groups G1A in the first region 11.

Therefore, when reading data from the selected cell in the second region 12, the potential of the selected bit line BL1 can be prevented from being fluctuated due to the cutoff current.

As explained above, in the memory cell array 10 of the MRAM in which the cell groups which are adjacent to each other in the x=direction, the y=direction, and the oblique direction achieve the translational relationship, the cell groups G1A and G1B in the first region 11 and the cell groups G2A and G2B in the second region 12 connected with the same main bit lines in common can be connected with the different sub-bit lines bBL1 and bBL2.

Therefore, according to the fourth embodiment of the present invention, like the first to third embodiments, degradation in a read margin due to the cutoff current can be suppressed in particular.

It is to be noted that the second read operation can be applied to the MRAM according to this embodiment. In this case, potentials of the pair of bit lines connected with the non-selected cells are set to a high potential (e.g., 0.4 V). As a result, degradation in a read margin can be suppressed, delay of an operation due to charge/discharge of the bit lines at the time of the read operation can be suppressed, and a speed of the read operation of the MRAM according to this embodiment can be increased.

[5] Fifth Embodiment

An MRAM according to a fifth embodiment of the present invention will now be explained with reference to FIGS. 19 and 20. It is to be noted that like reference numerals denote the same members as those in the first to fourth embodiments, thereby omitting a detailed description thereof.

In the first to fourth embodiments, the plurality of regions 11 and 12 are provided in the memory cell array 10, and the connection relationship of the pair of bit lines and the memory cells is changed in accordance with each of the memory cells MC1 and MC2 provided in each of the regions 11 and 12 by an ingenious layout of the bit lines or using the switching interconnect lines.

In the fifth embodiment according to the present invention, a description will now be given as to an example where degradation in a read margin can be suppressed and simplification of a layout in a memory cell array 10 and simplification of a manufacturing process can be achieved by an ingenious layout of memory cells adjacent to each other.

The MRAM according to the fifth embodiment of the present invention will now be described with reference to FIGS. 19 and 20.

(1) Structure

A structure of a memory cell array 10 in the MRAM according to the fifth embodiment of the present invention will now be described with reference to FIG. 19.

Figure 19:
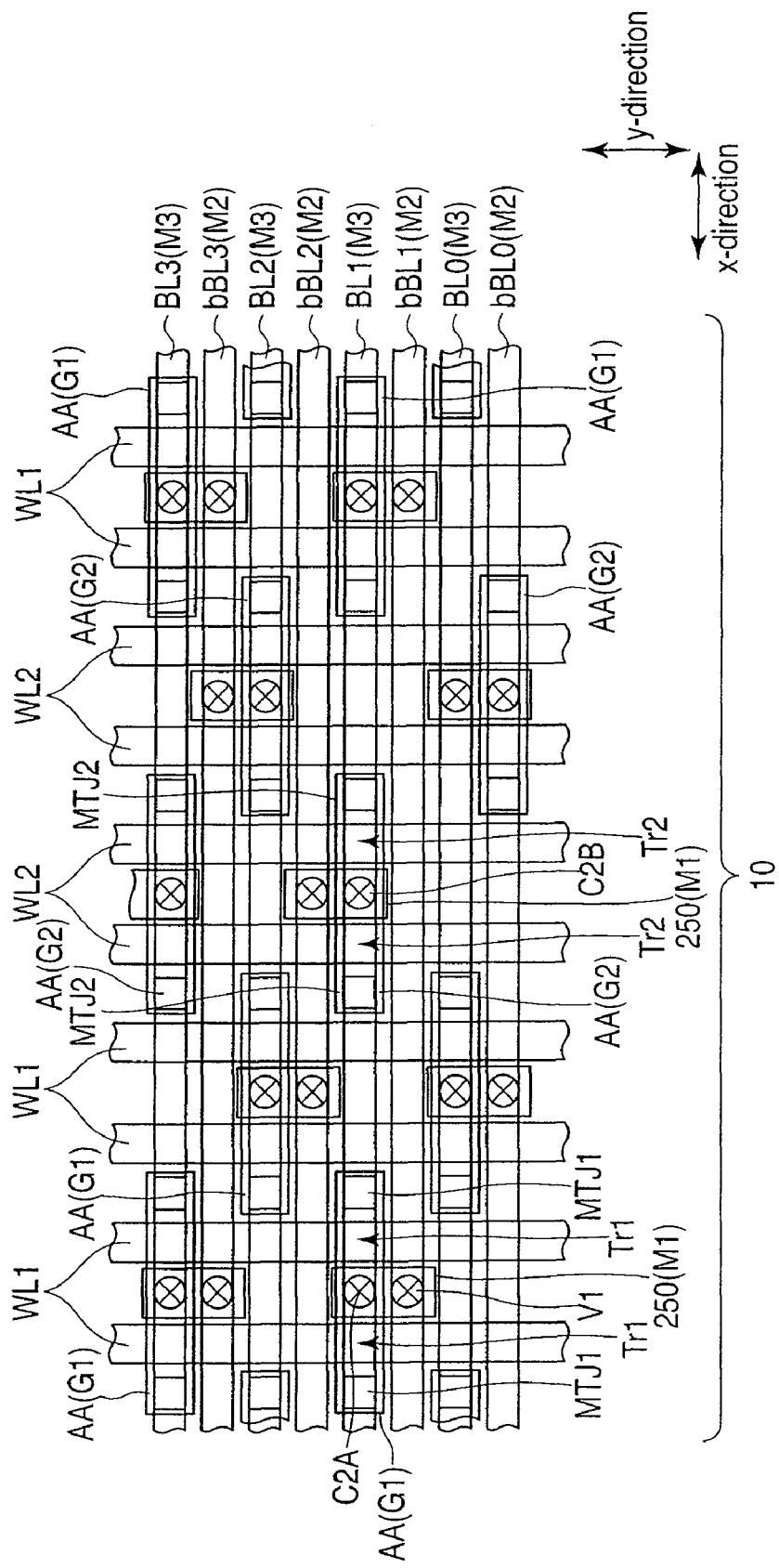
FIG. 19 is a plan view showing a layout of a memory cell array of an MRAM according to a fifth embodiment.

FIG. 19 shows a layout of the memory cell array 10 in the MRAM according to this embodiment. It is to be noted that like reference numerals denote the same members as those in the first to fourth embodiments, thereby omitting a detailed explanation thereof. Here, since a cross-sectional structure of a memory cell (a cell group) in the x-direction is substantially equal to that depicted in FIG. 15 in the fourth embodiment, a detailed description will be omitted. Further, a cross-sectional structure of a lead-out interconnect line 250 in the y-direction is substantially equal to that depicted in FIG. 16 in the fourth embodiment, thereby omitting a detailed explanation thereof.

As shown in FIG. 19, the memory cell array 10 in the MRAM according to the fifth embodiment of the present invention is not divided into a first region and a second region, differing from the memory cell arrays 10 according to the first to fourth embodiments. A plurality of cell groups G1 and G2 are arranged in the memory cell array 10 in the MRAM according to this embodiment in such a manner that the first and second cell groups G1 and G2 adjacent to each other in the x-direction have a mirror image relationship. Here, the mirror image relationship means a relationship obtained by reversing adjoining cell groups in the y-direction.

In the example depicted in FIG. 19, one first cell group G1 and a second cell group G2 having the mirror image relationship with the cell group G1 are alternately arranged in the x-direction, for example. The plurality of cell groups G1 connected with the same word line WL1 in common are arranged in the y-direction in, e.g., a translational relationship. Likewise, the plurality of cell groups G2 shared by and connected with the same word line WL2 are arranged in the y-direction in the translational relationship, for example. A word line utilized for a cell group that is adjacent to the cell group G1 in an oblique direction just runs between the cell group G1 and the cell group G2 adjacent to each other in the x-direction.

It is to be noted that a layout of the cell groups G1 and G2 is not restricted the example depicted in FIG. 19. For example, the plurality of cell groups G1 achieving the translational relationship may be continuously arranged in the x-direction, and the plurality of cell groups G2 achieving the mirror image relationship with the cell groups G1 may be continuously arranged in the x-direction.

In this embodiment, each of main bit lines BL0 to BL3 and sub-bit lines bBL0 to bBL3 has a linear shape and is extended on the memory cell array 10 in the x-direction.

The main bit lines BL0 to BL3 and the sub-bit lines bBL0 to bBL3 are alternately arranged in the y-direction. That is, a layout in which one main bit line BL1 is sandwiched between two sub-bit lines bBL1 and bBL2 is provided.

A direction of each lead-out interconnect line 250 that is led from the main bit line to the sub-bit line in the cell group G1 is opposite to that in the cell group G2. As a result, in this embodiment, the plurality of cell groups (the memory cells) G1 and G2 connected with one main bit line are connected with the different sub-bit lines.

In this manner, when the cell groups G1 and G2 which are adjacent to each other in the x-direction and has the mirror image relationship are arranged in the memory cell array 10 in a direction of the bit lines extend in, the plurality of cell groups G1 and G2 connected with the same main bit line in common can be connected with the different sub-bit lines.

Therefore, even if switching interconnect lines are not provided or ingenuity is not exercised with respect to the layout of the bit lines or the active regions, the plurality of cell groups (the memory cells) connected with the same main bit line in common can be connected with the different sub-bit lines in accordance with each cell group by changing a lead-out direction of the lead-out interconnect line. Thus, according to the MRAM of the fifth embodiment of the present invention, simplification of the layout in the memory cell array 10 and simplification of the manufacturing process of the MRAM can be achieved.

Furthermore, according to this embodiment, the bit line switching region that is used to form switching interconnect lines does not have to be provided between the first region and the second region in the memory cell array 10, thereby reducing a chip size.

Therefore, according to the MRAM of the fifth embodiment of the present invention, like the MRAMs according to the first to fourth embodiments, degradation in a read margin due to a cutoff current can be suppressed. Moreover, according to this embodiment, simplification of the layout and the manufacturing process of the MRAM can be achieved.

(2) Circuit Configuration and Operation

A read operation of the MRAM according to the fifth embodiment of the present invention will now be described with reference to FIG. 20. FIG. 20 is a schematic view for explaining an equivalent circuit of the memory cell array 10 in the MRAM according to this embodiment and an operation thereof.

Connection relationships of the first and second cell groups G1 and G2 with respect to the pairs of bit lines BL0 to BL3 and bBL0 to bBL3 are substantially equal in accordance with each of the main bit lines BL0 to BL3. The plurality of cell groups G1 and G2 connected with the main bit line BL1 will be taken as an example to be explained.

As shown in FIG. 20, in regard to the plurality of cell groups G1 and G2 connected with the same main bit lines BL1 in common, the first cell groups G1 and the second cell groups G2 are alternately arranged in the x-direction, for example. The second cell group G2 is a cell group arranged in the memory cell array 10 to form the mirror image relationship with respect to the first cell group G1.

In the cell groups G1 and G2 connected with the first main bit line BL1 in common, one end (a first or third terminal) of each of the magnetoresistive effect elements MTJ1 and MTJ2 is connected with the main bit line BL1. Additionally, one end (a shared node) of a current path of the two select transistors Tr1 included in the cell group G1 is connected with the first sub-bit line bBL1 and, on the other hand, one end (the shared node) of a current path of the two select transistors Tr2 included in the cell group G2 is connected with the second sub-bit line bBL2 differing from that for the cell group G1.

An example of reading data from the memory cell (the selected cell) MC1_S included in one first cell group G1 connected with the first main bit line BL1 will now be described. In this embodiment, a description will be given as an example using the first read operation.

First, the word line WL1_S connected with the selected cell MC1_S is set to a high potential, and the select transistor Tr1_S constituting the selected cell MC1_S is turned on.

Further, in the pair of bit lines BL1 and bBL1 connected with the selected cell MC1_S, a potential of the first main bit line BL1 is set to a high potential (e.g., 0.4 V), and a potential of the first sub-bit line bBL1 is set to a low potential (e.g., 0 V). As a result, a read current Ir flows through the selected cell MC_1_S, thereby reading data of the magnetoresistive effect element MTJ1_S in the selected cell MC1_S.

At this time, in each cell group G2 connected with the same main bit line BL1 as the selected cell MC1_S (the cell group G1) in common, a potential of the second sub-bit line bBL2 is set to a potential (e.g., 0.4 V) substantially equal to that of the main bit line BL1. As a result, potentials of the pair of bit lines BL1 and bBL2 connected with the cell group G2 become equal, and a cutoff current due to the select transistors in the cell group G2 is prevented from being generated. Therefore, a fluctuation in potential of the main bit line BL1 due to the cutoff current from each non-selected cell group G2 can be reduced.

Furthermore, when executing reading data with respect to a memory cell in the second cell group G2, set potentials for the sub-bit lines bBL1 and bBL2 are opposite to those in the read operation for the first cell group G1. That is, the potential of the main bit line BL1 is set to a high potential (e.g., 0.4 V), and the potential of the second sub-bit line bBL2 connected with the cell group G2 is set to a low potential (e.g., 0.4 V). Moreover, the potential of the first sub-bit line bBL1 connected with the cell group G1 is set to a potential (e.g., 0.4 V) substantially equal to that of the main bit line.

As a result, the cutoff current from each non-selected cell group G1 reduces a fluctuation in potential of the main bit line BL1 connected with the selected cell (the cell group G2).

As explained above, according to the fifth embodiment of the present invention, degradation in a read margin due to the cutoff current can be suppressed.

It is to be noted that the second read operation can be also applied to the MRAM according to this embodiment. In this case, potentials of the pair of bit lines connected with the non-selected cells are set to a high potential (e.g., 0.4 V). As a result, degradation in the read margin can be suppressed, and delay of an operation due to charge/discharge of the bit lines can be suppressed at the time of the read operation, thereby increasing a speed of the read operation of the MRAM according to this embodiment.

B. Other

According to the example of the present invention, degradation in a read margin can be suppressed.

It is to be noted that the MRAM using the magnetoresistive effect elements as resistive memory elements has been described as the semiconductor memory according to the example of the present invention in each of the first to fifth embodiments of the present invention. However, the example of the present invention is not restricted to the MRAM, and it can be applied to a semiconductor memory in which each memory cell is formed of at least one memory element and an MIS transistor functioning as a selective switch element with respect to the memory element. For example, the example of the present invention can be applied to a PCRAM (Phase Change Random Access Memory) using memory elements utilizing a change in crystal phase or an ReRAM (Resistive Random Access Memory) using memory elements utilizing a large change in resistance value due to application of a voltage. Even if the example of the present invention is applied to the PRAM or the ReRAM, the same effects as those described in each embodiment of the present invention can be obtained.

The example of the present invention is not restricted to the foregoing embodiments, and each constituent element can be modified and carried out within the scope of the present invention. Further, various kinds of inventions can be constituted by appropriately combining the plurality of constituent elements disclosed in the foregoing embodiments. For example, some constituent elements can be eliminated from all the constituent elements disclosed in the foregoing embodiments, or the constituent elements in the different embodiments may be appropriately combined.

What is claimed is:

1. A semiconductor memory comprising:
a first main bit line;
a pair of bit lines comprising the first main bit line and a first sub-bit line;
a first word line extended in a direction crossing a direction of extension of the first main bit line;
a first resistive memory element which comprises a first terminal and a second terminal, the first terminal being connected with the first main bit line;
a first select transistor which comprises a first current path and a first gate electrode connected with the first word line, a first end of the first current path being connected with the second terminal of the first resistive memory element, and a second end of the first current path being connected with the first sub-bit line;
a pair of bit lines comprising the first main bit line and a second sub-bit line;
a second word line extended in a direction crossing the direction of extension of the first main bit line;
a second resistive memory element which comprises a third terminal and a fourth terminal, the third terminal being connected with the first main bit line; and
a second select transistor which comprises a second current path and a second gate electrode connected with the second word line, a first end of the second current path being connected with the fourth terminal of the second resistive memory element, and a second end of the second current path being connected with the second sub-bit line.

2. The semiconductor memory of claim 1, wherein the first main bit line is at a high potential, the first sub-bit line is at a low potential, and the second sub-bit line is at a high potential, when executing a read operation with respect to the first memory cell.

3. The semiconductor memory of claim 1, further comprising:
a pair of bit lines comprising the second sub-bit line and a second main bit line;
a third resistive memory element which comprises a fifth terminal and a sixth terminal, the fifth terminal being connected with the second main bit line; and
a third select transistor which comprises a third current path and a third gate electrode connected with the first word line, a first end of the third current path being connected with the sixth terminal of the third resistive memory element, and a second end of the third current path being connected with the second sub-bit line.

4. The semiconductor memory of claim 3, wherein the first main bit line is at a high potential, the first sub-bit line is at a low potential, the second sub-bit line is at a high potential, and the second main bit line is at a high potential, when executing a read operation with respect to the first memory cell.

5. The semiconductor memory of claim 1, wherein the first and second resistive memory elements are magnetoresistive effect elements.

6. The semiconductor memory of claim 1, further comprising:
a sense amplifier connected with the first main bit line and configured to detect a fluctuation in a potential of the first main bit line.

* * * * *